United States Patent
Yang et al.

(10) Patent No.: US 11,721,774 B2
(45) Date of Patent: Aug. 8, 2023

(54) FULL WELL CAPACITY FOR IMAGE SENSOR

(71) Applicant: Taiwan Semiconductor Manufacturing Co., Ltd., Hsin-Chu (TW)

(72) Inventors: Kai-Yun Yang, Hsin-Chu (TW); Chun-Yuan Chen, Tainan (TW); Ching I Li, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 297 days.

(21) Appl. No.: 17/025,033

(22) Filed: Sep. 18, 2020

(65) Prior Publication Data

US 2021/0273123 A1    Sep. 2, 2021

Related U.S. Application Data

(60) Provisional application No. 62/982,559, filed on Feb. 27, 2020.

(51) Int. Cl.
*H01L 31/0304*     (2006.01)
*H01L 31/0352*     (2006.01)
(Continued)

(52) U.S. Cl.
CPC .. *H01L 31/03042* (2013.01); *H01L 27/14643* (2013.01); *H01L 27/14698* (2013.01);
(Continued)

(58) Field of Classification Search
CPC ......... H01L 31/03042; H01L 27/14643; H01L 27/14698; H01L 31/03529; H01L 31/1035;
(Continued)

(56) References Cited

U.S. PATENT DOCUMENTS 7,388,187 B1    6/2008   Liu et al.
8,809,758 B2    8/2014   Molnar et al.
(Continued)

OTHER PUBLICATIONS

Global Wafers Japan. "Production Methods of Single Crystal Silicon Ingots" The date of publication is unknown. Retrieved online on Jul. 1, 2021 from https://www.sas-globalwafers.co.jp/eng/products/wafer/crystal.html.
(Continued)

*Primary Examiner* — Jarrett J Stark
(74) *Attorney, Agent, or Firm* — Eschweiler & Potashnik, LLC

(57) ABSTRACT

Various embodiments of the present disclosure are directed towards an image sensor having a photodetector disposed in a semiconductor substrate. The photodetector comprises a first doped region comprising a dopant having a first doping type. A deep well region is disposed within the semiconductor substrate, where the deep well region extends from a back-side surface of the semiconductor substrate to a top surface of the first doped region. A second doped region is disposed within the semiconductor substrate and abuts the first doped region. The second doped region and the deep well region comprise a second dopant having a second doping type opposite the first doping type, where the second dopant comprises gallium.

20 Claims, 20 Drawing Sheets

(51) Int. Cl.
*H01L 31/18* (2006.01)
*H01L 27/146* (2006.01)
*H01L 31/103* (2006.01)

(52) U.S. Cl.
CPC .... *H01L 31/03529* (2013.01); *H01L 31/1035* (2013.01); *H01L 31/1864* (2013.01)

(58) Field of Classification Search
CPC ........... H01L 31/1864; H01L 27/14621; H01L 27/14627; H01L 27/1461; H01L 27/14612; H01L 27/14689; H01L 27/1463; H01L 27/1464
See application file for complete search history.

(56) References Cited

U.S. PATENT DOCUMENTS

| | | | | |
|---|---|---|---|---|
| 8,981,517 | B2 * | 3/2015 | Oshiyama | H01L 27/14687 257/481 |
| 9,160,953 | B2 * | 10/2015 | Oishi | H01L 27/1464 |
| 9,658,060 | B2 | 5/2017 | Molnar et al. | |
| 9,780,137 | B2 * | 10/2017 | Hsu | H01L 27/1464 |
| 9,876,045 | B2 * | 1/2018 | Komori | H01L 27/1464 |
| 10,468,543 | B2 | 11/2019 | Wang et al. | |
| 2007/0045684 | A1 * | 3/2007 | Lee | H01L 27/1463 257/292 |
| 2007/0210395 | A1 * | 9/2007 | Maruyama | H01L 27/14609 257/431 |
| 2008/0042233 | A1 * | 2/2008 | Kim | H01L 21/26586 257/E21.135 |
| 2008/0217659 | A1 | 9/2008 | Hung et al. | |
| 2009/0286342 | A1 * | 11/2009 | Takahashi | H01L 33/007 438/32 |
| 2010/0110239 | A1 * | 5/2010 | Ramappa | H01L 27/14603 348/E9.037 |
| 2010/0116971 | A1 * | 5/2010 | McCarten | H01L 27/14689 438/57 |
| 2010/0140675 | A1 * | 6/2010 | Rhodes | H01L 27/1464 257/292 |
| 2010/0167453 | A1 * | 7/2010 | Kim | H01L 27/1464 257/E31.127 |
| 2010/0314667 | A1 * | 12/2010 | Nozaki | H01L 27/14687 257/E31.073 |
| 2011/0140225 | A1 * | 6/2011 | Tsutsui | H01L 27/14636 257/443 |
| 2012/0104523 | A1 * | 5/2012 | Ikeda | H01L 27/14645 257/E31.127 |
| 2012/0319242 | A1 * | 12/2012 | Mao | H01L 27/1463 438/57 |
| 2013/0043550 | A1 * | 2/2013 | Arai | H01L 27/1461 257/E31.124 |
| 2013/0113061 | A1 * | 5/2013 | Lai | H01L 31/09 257/E31.127 |
| 2013/0234202 | A1 * | 9/2013 | JangJian | H01L 27/1464 438/94 |
| 2013/0292750 | A1 * | 11/2013 | Chen | H01L 27/1464 438/73 |
| 2014/0183606 | A1 * | 7/2014 | Kakehi | H01L 27/1464 438/42 |
| 2014/0264695 | A1 * | 9/2014 | Lee | H01L 27/14689 438/58 |
| 2014/0264719 | A1 * | 9/2014 | Chou | H01L 21/76237 257/506 |
| 2014/0347538 | A1 * | 11/2014 | Toda | H01L 27/14605 257/292 |
| 2015/0003777 | A1 * | 1/2015 | Tseng | H01L 27/14627 438/70 |
| 2015/0115382 | A1 * | 4/2015 | Wu | H01L 27/14689 438/70 |
| 2015/0270306 | A1 * | 9/2015 | Haddad | H01L 27/1463 257/432 |
| 2015/0349001 | A1 * | 12/2015 | Wang | H01L 27/14687 257/443 |
| 2016/0043120 | A1 * | 2/2016 | Ahn | H01L 27/14614 257/229 |
| 2016/0204150 | A1 * | 7/2016 | Oh | H01L 27/14609 257/229 |
| 2017/0117309 | A1 * | 4/2017 | Chen | H01L 27/1463 |
| 2017/0117315 | A1 * | 4/2017 | Chen | H01L 27/14689 |
| 2017/0263657 | A1 | 9/2017 | Chu et al. | |
| 2018/0204861 | A1 * | 7/2018 | Borthakur | H01L 27/14621 |
| 2018/0240838 | A1 | 8/2018 | Wen et al. | |
| 2018/0302581 | A1 | 10/2018 | Watanabe et al. | |
| 2018/0337211 | A1 | 11/2018 | Su et al. | |
| 2019/0096929 | A1 * | 3/2019 | Chiang | H01L 27/14612 |
| 2019/0131331 | A1 * | 5/2019 | Lee | H01L 27/1463 |
| 2019/0371838 | A1 * | 12/2019 | Takahashi | H01L 27/14603 |
| 2020/0266221 | A1 * | 8/2020 | Uchida | H01L 27/14603 |
| 2020/0328211 | A1 * | 10/2020 | Bl | H01L 29/161 |
| 2021/0210531 | A1 | 7/2021 | Park et al. | |
| 2021/0273123 | A1 * | 9/2021 | Yang | H01L 27/14698 |
| 2022/0182563 | A1 * | 6/2022 | Mun | H04N 5/374 |

OTHER PUBLICATIONS

Hoshikawa et al. Relationship Between Gallium Concentration and Resistivity of Gallium-Doped Czochralski Silicon Crystals: Investigation of a Conversion Curve. Japanese Journal of Applied Physics, vol. 47, No. 12, 2008, pp. 8691-8695, published on Dec. 19, 2008.

Glunz et al. "Minority Carrier Lifetime Degradation in Born-Doped Czochralski Silicon." Journal of Applied Physics 90, 2397 (2001), published on Aug. 23, 2001.

* cited by examiner

FULL WELL CAPACITY FOR IMAGE SENSOR

This application claims the benefit of U.S. Provisional Application No. 62/982,559, filed on Feb. 27, 2020, the contents of which are hereby incorporated by reference in their entirety.

BACKGROUND

Background

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices. However, CMOS pixel sensors have recently received more attention. Relative to CCD pixel sensors, CMOS pixel sensors provide lower power consumption, smaller size, and faster data processing. Further, CMOS pixel sensors provide a direct digital output of data, and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
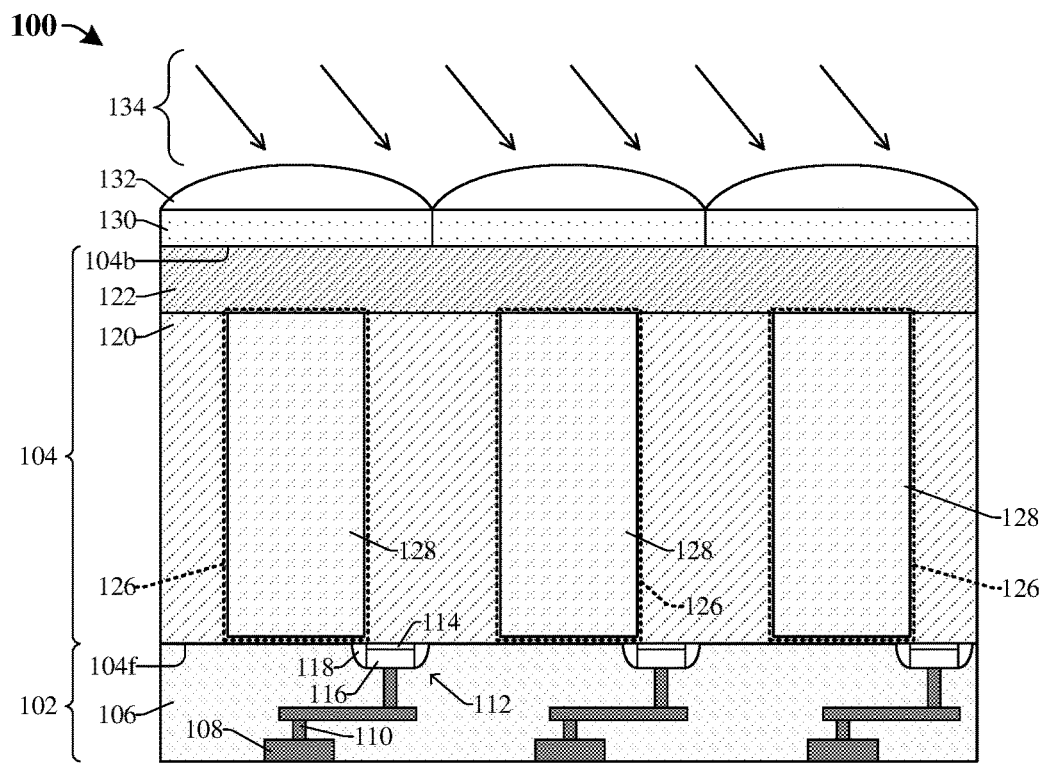
FIG. 1 illustrates a cross-sectional view of some embodiments of an image sensor comprising a plurality of photodetectors having first doped regions and a second doped region laterally surrounding the first doped regions, where the second doped region comprises a second dopant configured to improve full well capacity of the photodetectors.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, etc.) include an image sensor for capturing images. One example of such an image sensor is a complementary metal-oxide-semiconductor (CMOS) image sensor including an array of active pixel sensors. Each of the active pixel sensors comprises a photodetector disposed in a semiconductor substrate. The photodetector comprises a p-n junction that exists between a first doped region, which has a first doping type (e.g., n-type doping), and a second doped region, which has a second doping type (e.g., p-type doping) opposite the first doping type.

In the case of the CMOS image sensor, out-diffusion of dopants within the second doped region may occur during front-end of line processing steps. For example, a process for forming the CMOS image sensor may include performing a first ion implantation process into a front-side surface of a semiconductor substrate to define the first doped region. Further, a second ion implantation process is performed into the front-side surface of the semiconductor substrate to define the second doped region. The second ion implantation process may include implanting dopants (e.g., boron) that have a high likelihood to diffuse out of the second doped region during subsequent front-end of line processing steps (e.g., during formation of pixel devices (e.g., transistors) and/or an interconnect structure over the front-side surface). This may expand an area of the semiconductor substrate the second doped region occupies, thereby decreasing a size of the first doped region such that a volume of the photodetectors is reduced. Further, the out-diffusion of the dopants (e.g., boron) reduces a full well capacity (e.g., the amount of charge a photodetector can accumulate before saturation) of the photodetector because of the reduced size of the first doped region. Reducing the full well capacity of the photodetector may negatively affect the performance of the CMOS image sensor by, for example, reducing the high dynamic range of the active pixel sensors.

In various embodiments, the present disclosure is directed towards an image sensor that comprises a dopant (e.g., gallium), with a low likelihood to diffuse out, within the second doped region to improve full well capacity. In some embodiments, the image sensor has a photodetector having a first doped region disposed in a semiconductor substrate. The first doped region has a first doping type. A second doped region is disposed within the semiconductor substrate and abuts the first doped region. The second doped region comprises a second doping type opposite the first doping type. Further, the second doped region comprises the dopant (e.g., gallium) with relatively low diffusivity, thereby decreasing diffusion of the dopant from the second doped region during front-end of line processing steps and/or operation of the image sensor. This, in part, increases isolation between the first and second doped regions and increases the full well capacity of the photodetector, thereby improving performance of the image sensor.

FIG. 1 illustrates a cross-sectional view of some embodiments of an image sensor 100 comprising a plurality of photodetectors 126 having first doped regions 128 and a second doped region 120 laterally surrounding the first doped regions 128, where the second doped region 120 comprises a second dopant (e.g., gallium) configured to improve full well capacity of the photodetectors 126.

The image sensor 100 includes a semiconductor substrate 104 having a front-side surface 104f opposite a back-side surface 104b, and an interconnect structure 102 disposed along the front-side surface 104f. The semiconductor substrate 104 may, for example, be or comprise any type of semiconductor body (e.g., monocrystalline silicon, epitaxial silicon, CMOS bulk, silicon-germanium (SiGe), silicon on insulator (SOI), etc.). The plurality of photodetectors 126 are disposed within the semiconductor substrate 104. In some embodiments, the plurality of photodetectors 126 are arranged in an array comprising a plurality of rows (e.g., along an x-axis) and columns (e.g., along a y-axis) of photodetectors. The photodetectors 126 are configured to convert incident radiation or incident light 134 (e.g., photons) and generate respective electrical signals corresponding to the incident light 134.

The interconnect structure 102 includes an interconnect dielectric structure 106, a plurality of conductive wires 108, and a plurality of conductive vias 110. Further, a plurality of pixel devices 112 are disposed within/on the front-side surface 104f of the semiconductor substrate 104. The pixel devices 112 each comprises a gate electrode 116, a gate dielectric layer 114, and a sidewall spacer structure 118. The pixel devices 112 are configured to facilitate readout of the electrical signals produced by the photodetectors 126.

The photodetectors 126 each comprise a first doped region 128 (e.g., referred to as a photodetector collector region) comprising a dopant having a first doping type (e.g., n-type). Further, a second doped region 120 (e.g., referred to as a photodetector well region) is disposed within the semiconductor substrate 104 and adjoins the first doped region 128. The second doped region 120 has a second doping type (e.g., p-type) that is opposite the first doping type. In some embodiments, the first doping type is n-type and the second doping type is p-type, or vice versa. In some embodiments, a depletion region forms (e.g., due to p-n junctions between the first doped region 128 and the second doped region 120) within each photodetector 126.

In addition, a deep well region 122 is disposed in the semiconductor substrate 104 and along the back-side surface 104b of the semiconductor substrate 104. The deep well region 122 extends into the semiconductor substrate 104 from the back-side surface 104b of the semiconductor substrate 104 to a point below the back-side surface 104b. In some embodiments, the deep well region 122 comprises the second doping type (e.g., p-type). A plurality of light filters 130 (e.g., color filters) are disposed over the back-side surface 104b of the semiconductor substrate 104. The plurality of light filters 130 are respectively configured to transmit specific wavelengths of incident light 134. A plurality of micro-lenses 132 are disposed over the plurality of light filters 130. The micro-lenses 132 are configured to focus the incident light 134 towards the photodetectors 126.

In some embodiments, the second doped region 120 and/or the deep well region 122 respectively comprise a second dopant having the second doping type (e.g., p-type) with a low likelihood to diffuse out. The second dopant may, for example, be or comprise gallium (Ga) that has a low likelihood to diffuse out of the second doped region 120 and/or the deep well region 122 during fabrication and/or operation of the image sensor 100. For example, during fabrication of the image sensor 100, the first doped region 128 may be formed within the semiconductor substrate 104. Subsequently, the second doped region 120 and/or the deep well region 122 may be formed by, for example, implanting the second dopant (e.g., $Ga^{+3}$) with a sufficiently large atomic size (e.g., about 62 picometers (pm)). In such embodiments, the second dopant facilitates the second doped region 120 and/or the deep well region 122 having sufficient hole concentration (e.g., at least $1*10^{18}$) while mitigating diffusion of the second dopant across the lattice of the semiconductor substrate 104 to, for example, the first doped region 128. In some embodiments, if the second doped region 120 is formed with another dopant (e.g., boron (e.g., $B^{3+}$) having a relatively small atomic size (e.g., about 23 pm), then the another dopant (e.g., boron) may easily traverse the lattice structure of the semiconductor substrate 104 to the first doped region 128, thereby increasing a size of the second doped region 120 and decreasing a size of the first doped region 128. This, in part, reduces a full well capacity of the photodetectors 126, thereby adversely affecting performance of the image sensor 100 (e.g., reducing the high dynamic range of the image sensor 100). In yet further embodiments, if the second doped region 120 is formed with yet another dopant (e.g., indium (e.g., $In^{3+}$) having a relatively large atomic size (e.g., about 92 pm), then a solid solubility of the dopant (e.g., indium) is too low, thereby reducing a concentration of holes within the second doped region 120 and adversely affecting performance of the image sensor 100. Thus, by virtue of the second doped region 120 and/or the deep well region 122 respectively comprising the second dopant (e.g., gallium) with a low likelihood to diffuse out the full well capacity of the photodetectors 126 is increased, thereby increasing a performance of the image sensor 100.

In yet further embodiments, a diffusivity of the second dopant (e.g., gallium) at relatively high temperatures (e.g., about 700 degrees Celsius or greater) is relatively low (e.g., less than about $5.4*10-15$ cm$^2$/s). This, in part, mitigates diffusion of the second dopant during front-end of line formation processes and/or during operation of the image sensor 100. In another embodiment, if the second doped region 120 comprises another dopant (e.g., boron) with a relatively high diffusivity (e.g., about $1.7*10-14$ cm$^2$/s or greater) at the relatively high temperatures, then a greater concentration of the another dopant (e.g., boron) diffuses into the first doped regions 128 during front-end of line formation processes and/or operation of the image sensor 100. This decreases a hole concentration in the second doped region 120, decreases isolation between photodetectors 126, and decreases the full well capacity of the photodetectors 126. Further, in an effort to increase a number of semiconductor devices disposed within/or on the semiconductor substrate 104, a size of the photodetectors 126 may be decreased. The relatively low diffusivity of the second dopant (e.g., gallium) promotes electrical isolation between the photodetectors 126 as the feature size of the photodetectors 126 is decreased, thereby increasing performance of the image sensor 100.

In addition, a depletion region forms along the perimeter of each first doped region 128 (e.g., due to p-n junctions between the first doped region 128 and the second doped region 120 and/or the deep well region 122). In some embodiments, when the incident light 134 (containing photons of sufficient energy) strikes a corresponding photodetector 126, an electron-hole pair is created. If the absorption occurs in the junction's depletion region (e.g., one or more diffusion length(s) away from it) the carriers of the electron-hole pair are swept from the junction by the built-in electric field of the depletion region. Thus, holes move towards an anode region of the corresponding photodetector 126 and electrons move toward a cathode region of the corresponding photodetector 126, thereby producing a photocurrent. Due to the relatively low diffusivity of the second dopant (e.g., gallium), a strength of the built-in electric field of the depletion region is increased, thereby ensuring the electrons move toward the cathode region of the photodetector 126. This, in part, increases isolation between adjacent photodetectors 126 and prevents the recombination of charge carriers (e.g., electrons) at sidewalls of an isolation structure (e.g., sidewalls of the isolation structure 206 of FIG. 2).

Figure 2:
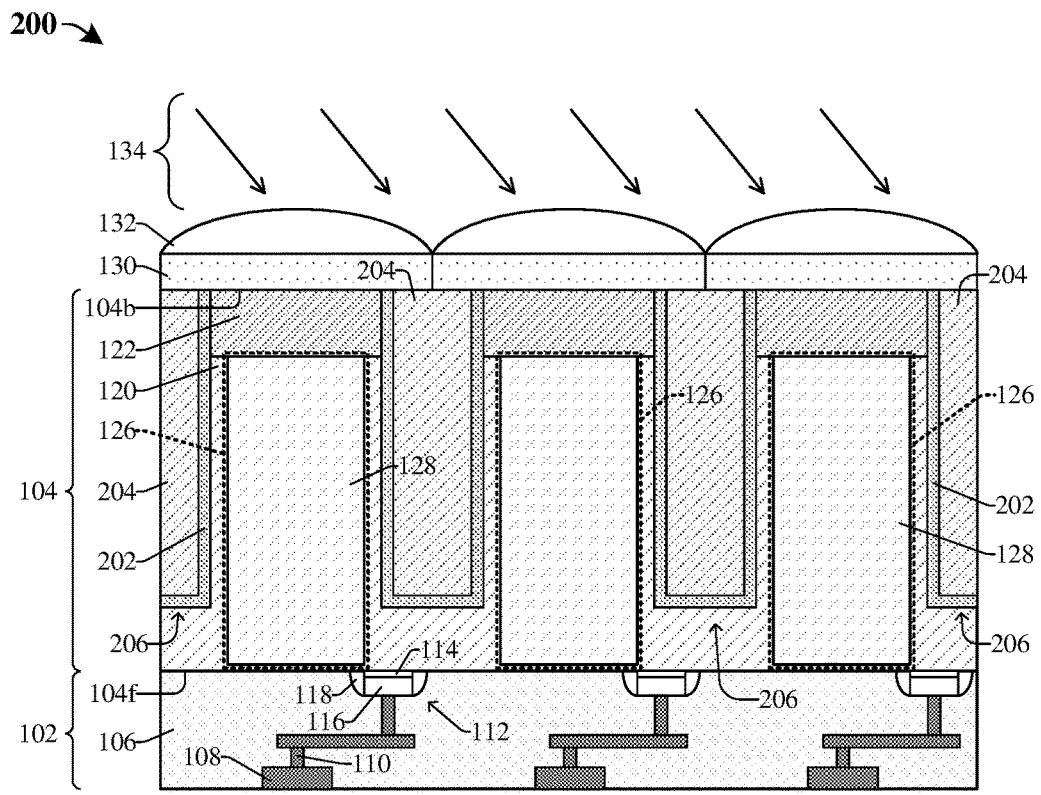
FIG. 2 illustrates a cross-sectional view of some embodiments of an image sensor comprising an isolation structure disposed between first doped regions, where a second doped region extends along sidewalls of the isolation structure.

FIG. 2 illustrates a cross-sectional view of some embodiments of an image sensor 200 corresponding to some alternative embodiments of the image sensor 100 of FIG. 1.

The image sensor 200 includes an interconnect structure 102 disposed along a front-side surface 104f of a semiconductor substrate 104. In some embodiments, the semiconductor substrate 104 may, for example, be or comprise a bulk substrate (e.g., a bulk silicon substrate), a silicon on insulator substrate, crystalline silicon, monocrystalline silicon, epitaxial silicon, doped epitaxial silicon, an oxygen free silicon substrate, an oxygen rich silicon substrate, P-doped silicon, or another suitable semiconductor material. The interconnect structure 102 includes an interconnect dielectric structure 106, a plurality of conductive wires 108, and a plurality of conductive vias 110. In some embodiments, the interconnect dielectric structure 106 comprises one or more inter-metal dielectric (IMD) layers. The interconnect structure 102 is configured to electrically couple semiconductor devices disposed within and/or on the semiconductor substrate 104 to one another. In further embodiments, the conductive wires 108 and/or the conductive vias 110 may, for example, be or comprise aluminum, copper, tungsten, titanium, tantalum, titanium nitride, tantalum nitride, ruthenium, another conductive material, or any combination of the foregoing. In yet further embodiments, the IMD layers may, for example, be or comprise an oxide such as silicon dioxide, a low-k dielectric material, an extreme low-k dielectric material, another dielectric material, or any combination of the foregoing. As used herein, a low-k dielectric material is a dielectric material with a dielectric constant less than 3.9.

Further, a plurality of pixel devices 112 are disposed along the front-side surface 104f of the semiconductor substrate 104. The pixel devices 112 can, for example, be configured as transistors and comprise a gate electrode 116, a gate dielectric layer 114, and a sidewall spacer structure 118. The gate dielectric layer 114 is disposed between the gate electrode 116 and the semiconductor substrate 104. Further, the sidewall spacer structure 118 is disposed along sidewalls of the gate electrode 116 and sidewalls of the gate dielectric layer 114. The plurality of pixel devices 112 may, for example, be or comprise transfer transistor(s), source-follower transistor(s), row-select transistor(s), reset transistor(s), another suitable pixel device, or any combination of the foregoing. The plurality of pixel devices 112 are electrically coupled to the conductive wires and vias 108, 110. The gate electrode 116 may, for example, be or comprise polysilicon, doped polysilicon, a metal material such as aluminum, copper, titanium, tantalum, tungsten, titanium nitride, tantalum nitride, another suitable material, or any combination of the foregoing. The gate dielectric layer may, for example, silicon dioxide, a high-k dielectric material, a combination of the foregoing, or the like. As used herein, a high-k dielectric material is a dielectric material with a dielectric constant greater than 3.9. Further, the sidewall spacer structure 118 may, for example, be or comprise silicon nitride, silicon carbide, another dielectric material, or any combination of the foregoing.

A plurality of photodetectors 126 are disposed within the semiconductor substrate 104. The photodetectors 126 each comprise a first doped region 128 having a first doping type (e.g., n-type) with a doping concentration of the ranging between about $10^{14}$ to $10^{18}$ atoms/cm$^3$, or another suitable value. Further, a second doped region 120 is disposed within the semiconductor substrate 104 and laterally surrounds the first doped region 128. The second doped region 120 has a second doping type (e.g., p-type) that is opposite the first doping type. In various embodiments, a doping concentration of the first doped region 128 is less than a doping concentration of the second doped region 120. Further, a deep well region 122 is disposed within the semiconductor substrate 104 along a back-side surface 104b of the semiconductor substrate 104. The deep well region 122 extends from the back-side surface 104b of the semiconductor substrate 104 to a top surface of the first doped region 128. The deep well region 122 comprises the second doping type (e.g., p-type). In some embodiments, the second doped region 120 and the deep well region 122 comprise a second dopant having the second doping type (e.g., p-type) with a low likelihood to diffuse out. The second dopant may, for example, be or comprise gallium (Ga) that has a low likelihood to diffuse out of the second doped region 120 and/or the deep well region 122 during fabrication and/or operation of the image sensor 100. This, in part, increases a full well capacity of the photodetectors 126, thereby increasing a performance of the image sensor 200. It will be appreciated that the second dopant comprising another element is also within the scope of the disclosure.

In some embodiments, the second doped region 120 and the deep well region 122 have a first doping concentration of the second dopant (e.g., gallium) ranging between about $10^{14}$ to $2*10^{18}$ atoms/cm$^3$, or another suitable value. In further embodiments, if the first doping concentration of the second dopant is relatively low (e.g., less than about $10^{14}$ atoms/cm$^3$), then a concentration of holes may be relatively low, thereby decreasing electrical isolation between the plurality of photodetectors 126. In yet further embodiments, if the first doping concentration of the second dopant is relatively high (e.g., greater than about $2*10^{18}$ atoms/cm$^3$), then a maximum solid solubility of the second dopant within the semiconductor substrate 104 may be surpassed. In such embodiments, solid precipitates may form in the semiconductor substrate 104 that cause defects in the semiconductor substrate 104 and decrease a performance of the photodetectors 126. In some embodiments, a doping concentration of the second doped region 120 and/or the deep well region 122 is greater than a doping concentration of the first doped region 128.

In addition, an isolation structure 206 extends from the back-side surface 104b of the semiconductor substrate 104 to a point below the back-side surface 104b. The isolation structure 206 can, for example, be configured as a deep trench isolation (DTI) structure, a back-side deep trench isolation (BDTI) structure, a front-side deep trench isolation (FDTI) structure, or another suitable isolation structure. The isolation structure 206 is disposed between adjacent photodetectors 126 and is configured to electrically isolate the photodetectors 126 from one another. Further, the isolation structure 206 comprises a passivation layer 202 a trench fill layer 204. The passivation layer 202 is disposed between the trench fill layer 204 and the semiconductor substrate 104. The passivation layer 202 may, for example, be or comprise aluminum oxide ($Al_2O_3$), hafnium oxide ($HfO_2$), titanium oxide ($Ta_2O_5$), another high-k dielectric material, any combination of the foregoing, or the like. The trench fill layer 204 may, for example, be or comprise silicon dioxide, polysilicon, amorphous silicon, doped polysilicon, another dielectric material, or any combination of the foregoing. In yet further embodiments, a refractive index of the trench fill layer 204 is less than a refractive index of the semiconductor substrate 104.

A plurality of light filters 130 (e.g., color filters) are disposed over the back-side surface 104b of the semiconductor substrate 104. The light filters 130 are respectively configured to transmit specific wavelengths of incident light 134. For example, a first light filter (e.g., a red light filter) may transmit light having wavelengths within a first range, while a second light filter (e.g., a green light filter) may transmit light having wavelengths within a second range different than the first range. In some embodiments, the plurality of light filters 130 may be arranged within a grid structure overlying the photodetectors 126. A plurality of micro-lenses 132 are arranged over the plurality of light filters 130. In some embodiments, the plurality of micro-lenses 132 have a substantially flat bottom surface abutting the plurality of light filters 130 and a curved upper surface. The curved upper surface is configured to focus the incident light 134 towards the underlying photodetectors 126.

Figure 3A:
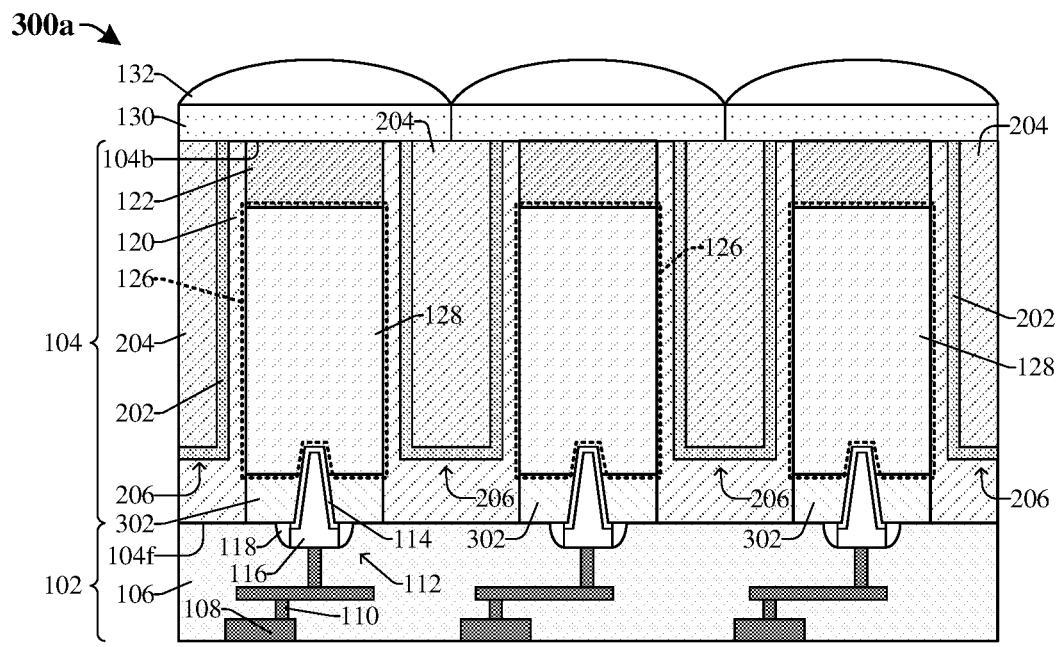
FIGS. 3A-3C, 4A-4B, and 5A-5B illustrate cross-sectional views of some embodiments of image sensors according to some alternative embodiments of the image sensor of FIG. 2.

FIG. 3A illustrates a cross-sectional view of some embodiments of an image sensor 300a corresponding to some alternative embodiments of the image sensor 200 of FIG. 2, in which the pixel devices 112 are configured as vertical transistors. In such embodiments, the pixel devices 112 may be configured as vertical transfer transistors, where the gate electrode 116 extends continuously from the front-side surface 104f of the semiconductor substrate 104 to a point above the front-side surface 104f. In some embodiments, the point is disposed above a bottom surface of the first doped region 128 such that the gate electrode 116 extends into the first doped region 128. Further, the gate dielectric layer 114 is disposed between the gate electrode 116 and the first doped region 128. A third doped region 302 of the semiconductor substrate 104 is disposed between the first doped region 128 and the front-side surface 104f of the semiconductor substrate 104. In yet further embodiments, the third doped region 302 comprises the second doping type (e.g., p-type). In yet further embodiments, the third doped region 302 comprises another dopant (e.g., boron) with a doping concentration within a range of about $10^{14}$ to $5*10^{15}$ atoms/cm$^3$, or another suitable value. In various embodiments, a doping concentration of the third doped region 302 is less than a doping concentration of the second doped region 120. Further, the second doped region 120 continuously extends along opposing sidewalls of the passivation layer 202 from the back-side surface 104b of the semiconductor substrate 104 to a bottom surface of the passivation layer 202.

During operation of the image sensor 300a, the pixel devices 112 may, for example, be configured to transfer charge collected in a corresponding photodetector 126 to a floating node (not shown) disposed within the semiconductor substrate 104. If the charge level is sufficiently high within the floating node, a source-follower transistor (not shown) is activated and charge is selectively output according to operation of a row-select transistor (not shown) used for addressing. A reset transistor (not shown) can be used to reset the photodetectors 126 between exposure periods.

Figure 3B:
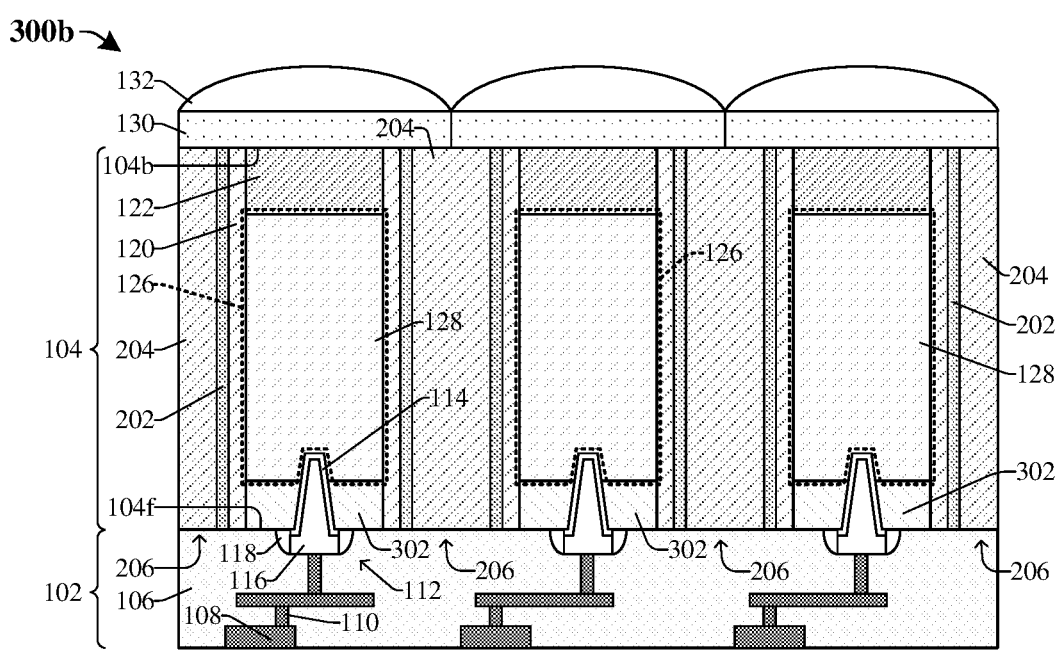

FIG. 3B illustrates a cross-sectional view of some embodiments of an image sensor 300b corresponding to some alternative embodiments of the image sensor 300a of FIG. 3A, in which the isolation structure 206 extends continuously from the back-side surface 104b of the semiconductor substrate 104 to the front-side surface 104f of the semiconductor substrate 104.

Figures 3C, 4A:
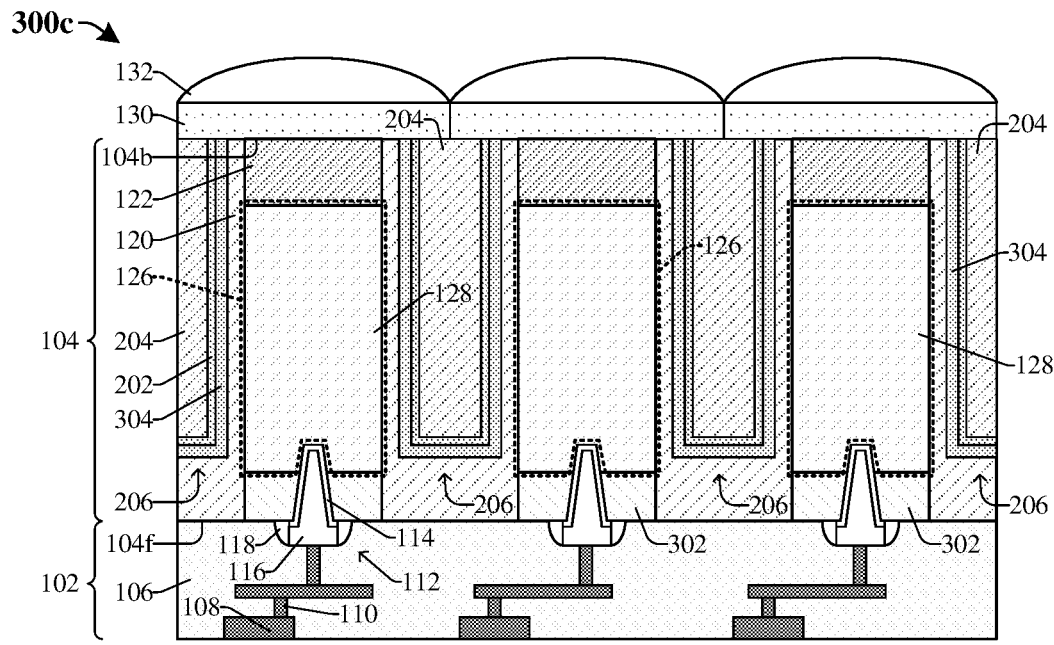

FIG. 3C illustrates a cross-sectional view of some embodiments of an image sensor 300c corresponding to some alternative embodiments of the image sensor 300a of FIG. 3A, in which a doped liner 304 is disposed between the passivation layer 202 and the semiconductor substrate 104. In some embodiments, the doped liner 304 comprises the second dopant (e.g., gallium) with a doping concentration within a range of about between about $10^{14}$ to $2*10^{18}$ atoms/cm$^3$, or another suitable value. In yet further embodiments, the doped liner 304 may facilitate formation of the second doped region 120 (e.g., see FIGS. 15-18). In some embodiments, the doped liner 304 may be a doped region of the semiconductor substrate 104 formed by a plasma doping process. In an alternative embodiment, the doped liner 304 may be or comprise an epitaxial silicon layer formed by an epitaxial process.

FIG. 4A illustrates a cross-sectional view of some embodiments of an image sensor 400a corresponding to some alternative embodiments of the image sensor 200 of FIG. 2, in which the passivation layer 202 and the trench fill layer 204 continuously extend along the back-side surface 104b of the semiconductor substrate 104.

Figure 4B:
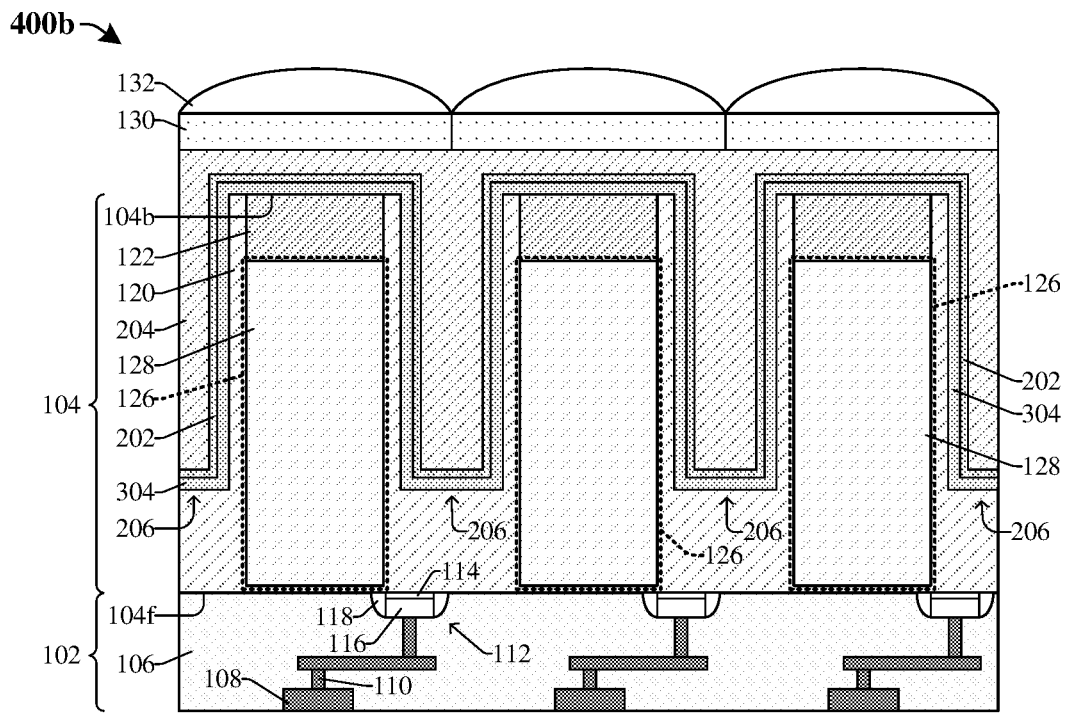

FIG. 4B illustrates a cross-sectional view of some embodiments of an image sensor 400b corresponding to some alternative embodiments of the image sensor 400a of FIG. 4A, in which the doped liner 304 is disposed between the semiconductor substrate 104 and the passivation layer 202. In such embodiments, the doped liner 304 continuously extends along the back-side surface 104b of the semiconductor substrate 104.

Figure 5A:
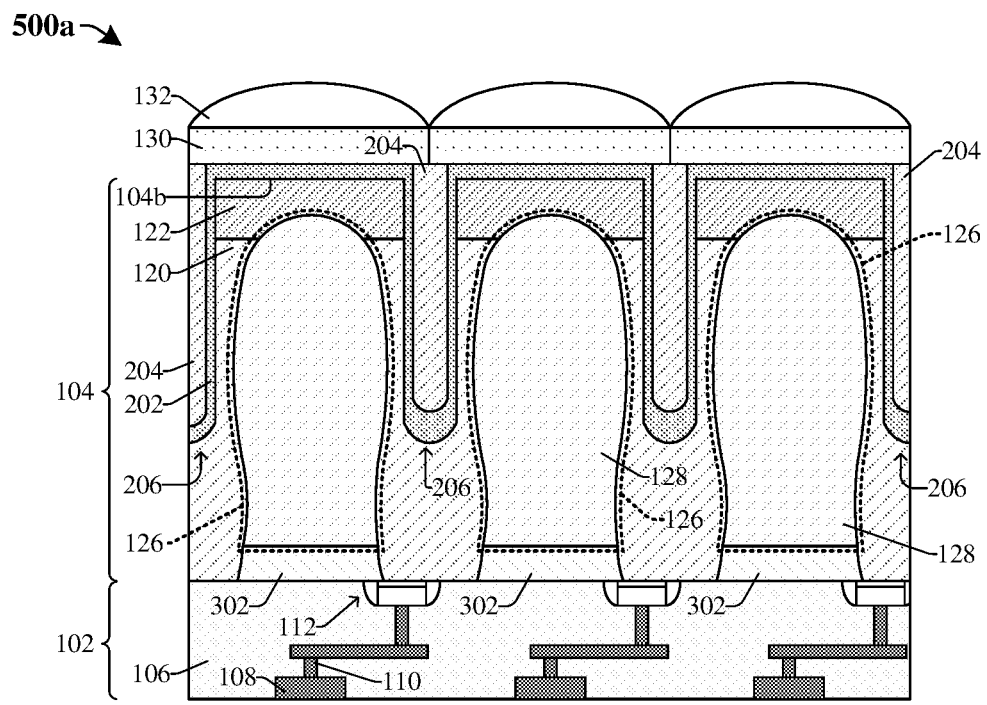

FIG. 5A illustrates a cross-sectional view of some embodiments of an image sensor 500a corresponding to some alternative embodiments of the image sensor 200 of FIG. 2, in which a bottom surface of the isolation structure 206 is curved. Further, the passivation layer 202 continuously extends along the back-side surface 104b of the semiconductor substrate 104.

Figure 5B:
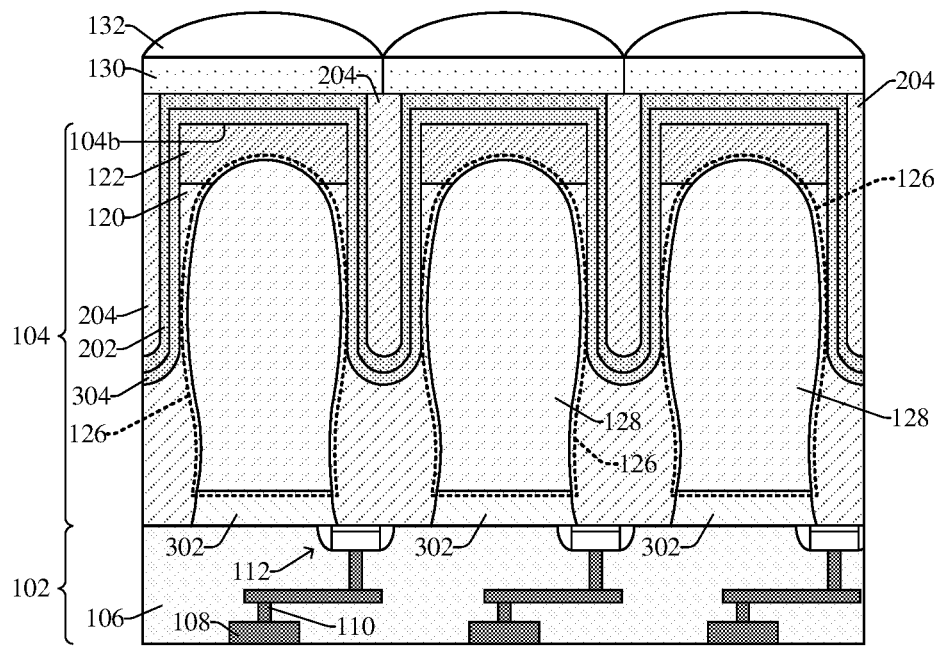

FIG. 5B illustrates a cross-sectional view of some embodiments of an image sensor 500b corresponding to some alternative embodiments of the image sensor 500b of FIG. 5B, in which the doped liner 304 is disposed between the semiconductor substrate 104 and the passivation layer 202.

Figure 6A:
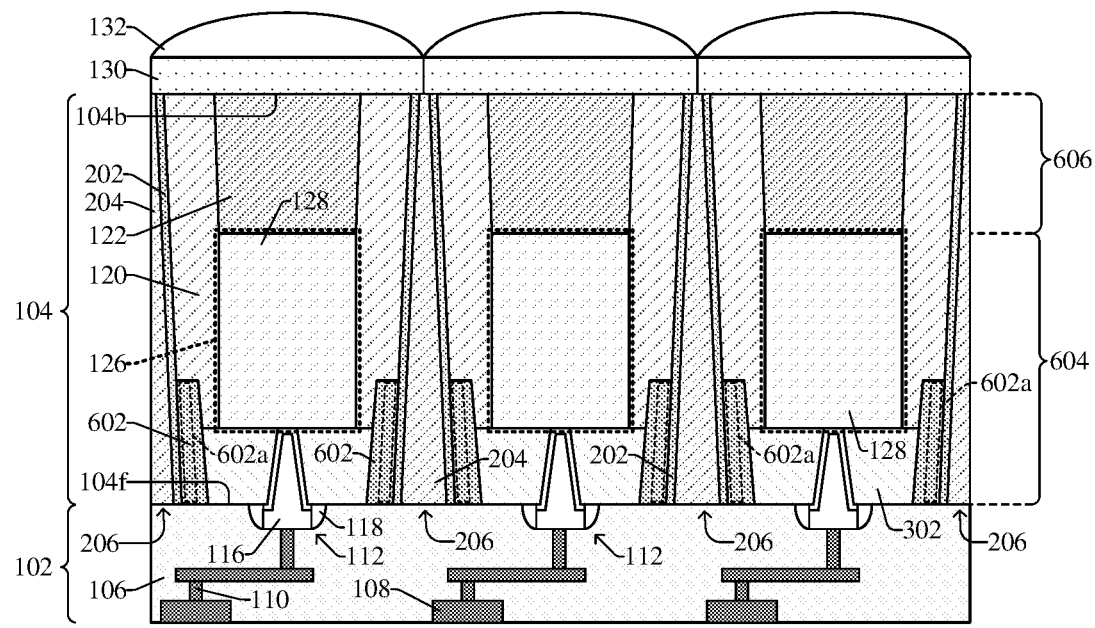
FIGS. 6A-6C illustrate cross-sectional views of some embodiments of image sensors comprising a plurality of first doped regions and an isolation structure laterally enclosing the first doped regions, where a second doped region is disposed between the isolation structure and the first doped regions.

FIG. 6A illustrates a cross-sectional view of some embodiments of an image sensor 600a comprising a plurality of first doped regions 128 and an isolation structure 206 laterally enclosing the first doped regions 128, where a second doped region 120 comprising a second dopant (e.g., gallium) is disposed between the isolation structure 206 and the first doped regions 128.

In some embodiments, the image sensor 600a comprises a shallow trench isolation (STI) structure 602 disposed within the semiconductor substrate 104. In some embodiments, the semiconductor substrate 104 may, for example, be or comprise any type of semiconductor body (e.g., silicon/germanium/CMOS bulk, SiGe, SOI, etc.) such as a semiconductor wafer or one or more die on a wafer, as well as any other type of semiconductor and/or epitaxial layers. For example, the semiconductor substrate 104 may be or comprise a first epitaxial layer 604 underlying a second epitaxial layer 606. In some embodiments, the first epitaxial layer 604 may be or comprise a p-type epitaxial silicon layer having a thickness of about 5.4 micrometers (um), about 6 um, within a range of about 5.4 to 6 um, or another suitable value. In yet further embodiments, the first epitaxial layer 604 may be or comprise an n-type epitaxial silicon layer having a thickness of about 11 um, within a range of about 10.5 to 11.5 um, or another suitable value. In further embodiments, the second epitaxial layer 606 may be or comprise a p-type epitaxial silicon layer having a thickness of about 2 um, 4 um, 6 um, 8 um, 10 um, within a range of about 4 to 11 um, or another suitable value. In yet further embodiments, the first and second epitaxial layers 604, 606 are crystalline silicon.

Further, the deep well region 122 is disposed from a bottom surface of the second epitaxial layer 606 to a top surface of the second epitaxial layer 606. The first doped regions 128 are disposed within the first epitaxial layer 604 and underlie the deep well region 122. Further, the second doped region 120 extends from a sidewall of the STI structure 602 to a top surface of the second epitaxial layer 606. In some embodiments, the deep well region 122 and the second doped region 120 comprise the second dopant (e.g., gallium) having the second doping type (e.g., p-type). Furthermore, the isolation structure 206 extends from the front-side surface 104f of the semiconductor substrate 104, through the STI structure 602, to the back-side surface 104b of the semiconductor substrate 104. In some embodiments, regions 602a of the STI structure 602 disposed between the isolation structure 206 and corresponding first doped regions 128 may comprise the second dopant (e.g., gallium). In such embodiments, the second doped region 120 may be formed by an annealing process and/or an oxidation process (e.g., see FIGS. 17, 25, and/or 30), such that the second dopant (e.g., gallium) is driven into the regions 602a of the STI structure 602. In addition, the isolation structure 206 continuously extends from the front-side surface 104f to the back-side surface 104b of the semiconductor substrate 104. In some embodiments, a width of the isolation structure 206 continuously decreases from the front-side surface 104f to the back-side surface 104b of the semiconductor substrate 104.

Figure 6B:
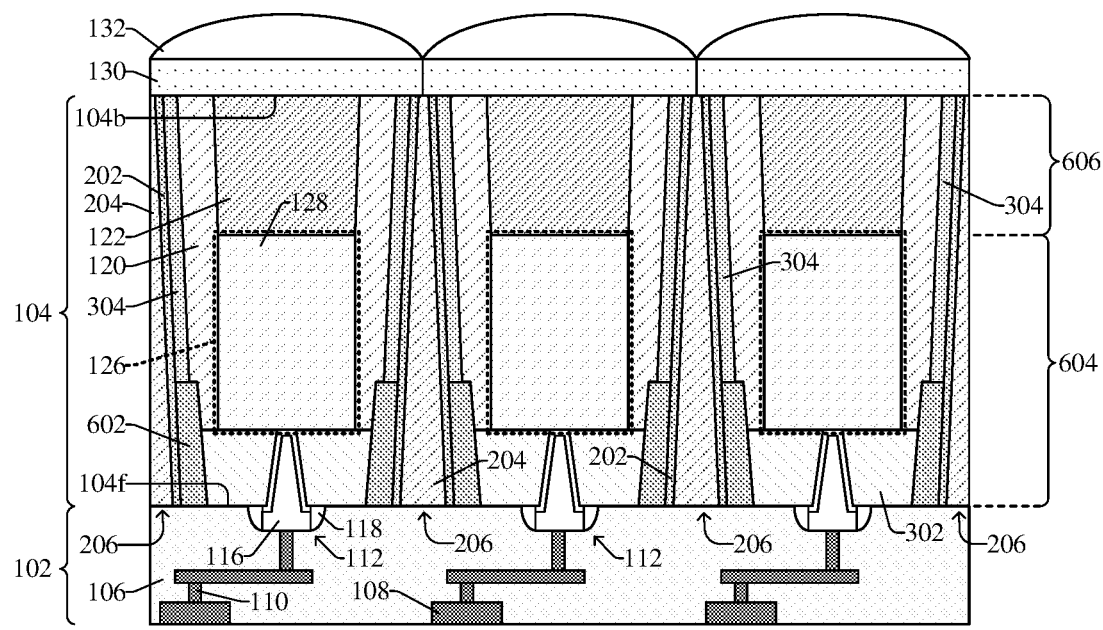

FIG. 6B illustrates a cross-sectional view of some embodiments of an image sensor 600b corresponding to some alternative embodiments of the image sensor 600a of FIG. 6A, in which the doped liner 304 is disposed between the isolation structure 206 and the semiconductor substrate 104. The doped liner 304 extends continuously from a top surface of the STI structure 602 to the back-side surface 104b of the semiconductor substrate 104.

Figure 6C:
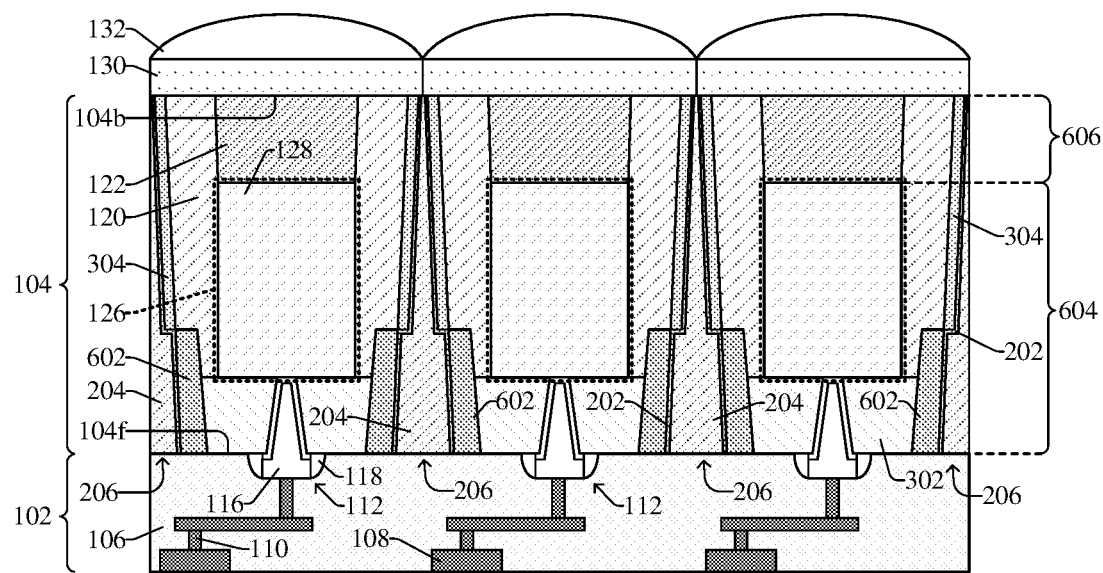

FIG. 6C illustrates a cross-sectional view of some embodiments of an image sensor 600c corresponding to some alternative embodiments of the image sensor 600b of FIG. 6B, in which a width of the passivation layer 202 and the trench fill layer 204 discretely decrease from the front-side surface 104f of the semiconductor substrate to the back-side surface 104b. Here, the doped liner 304 may, for example, be or comprise an epitaxial silicon layer doped with the second dopant (e.g., gallium).

FIGS. 7-11 illustrate cross-sectional views 700-1100 of some embodiments of a first method of forming an image sensor comprising a plurality of photodetectors having first doped regions and a second doped region laterally surrounding the first doped regions, where the second doped region comprises a second dopant configured to improve full well capacity of the photodetectors, according to the present disclosure. Although the cross-sectional views 700-1100 shown in FIGS. 7-11 are described with reference to the first method, it will be appreciated that the structures shown in FIGS. 7-11 are not limited to the first method but rather may stand alone separate of the first method. Furthermore, although FIGS. 7-11 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 7:
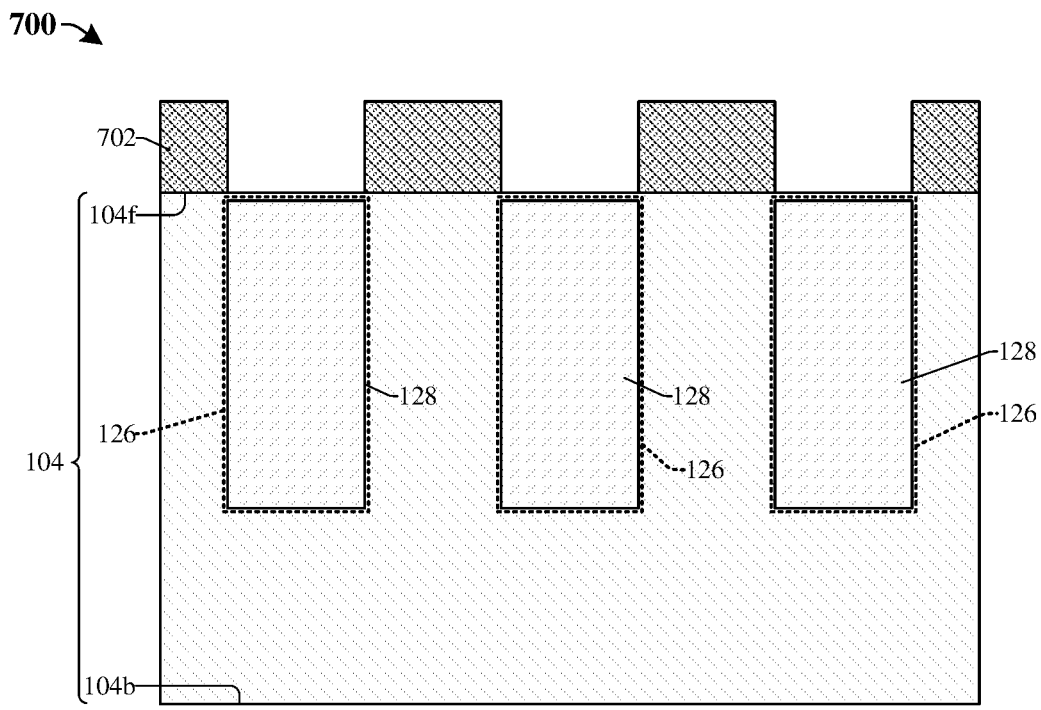
FIGS. 7-11 illustrate cross-sectional views of some embodiments of a first method of forming an image sensor comprising a plurality of photodetectors having first doped regions and a second doped region laterally surrounding the first doped regions, where the second doped region comprises a second dopant configured to improve full well capacity of the photodetectors.

As illustrated in cross-sectional view 700 of FIG. 7, a plurality of photodetectors 126 are formed within a semiconductor substrate 104. In some embodiments, the semiconductor substrate 104 may, for example, be or comprise a bulk substrate (e.g., a bulk silicon substrate), a silicon on insulator (SOI) substrate, crystalline silicon, monocrystalline silicon, epitaxial silicon, silicon germanium (SiGe), doped epitaxial silicon, an oxygen free silicon substrate, an oxygen rich silicon substrate, P-doped silicon, or another suitable semiconductor material. Further, the semiconductor substrate 104 comprises a front-side surface 104f that is opposite a back-side surface 104b. The plurality of photodetectors 126 respectively comprise a first doped region 128 disposed within the semiconductor substrate 104. In various embodiments, a process for forming the plurality of photodetectors 126 includes: selectively forming a masking layer 702 over the front-side surface 104f of the semiconductor substrate 104; performing a selective ion implantation process according to the masking layer 702, thereby implanting one or more dopants within the semiconductor substrate 104 and forming the first doped regions 128; and performing a removal process to remove the masking layer 702 (not shown). The one or more dopants may, for example, be or comprise phosphorus, arsenic, antimony, another suitable n-type dopant, or any combination of the foregoing with a first doping type (e.g., n-type). Thus, the first doped regions 128 have the first doping type (e.g., n-type).

Figure 8:
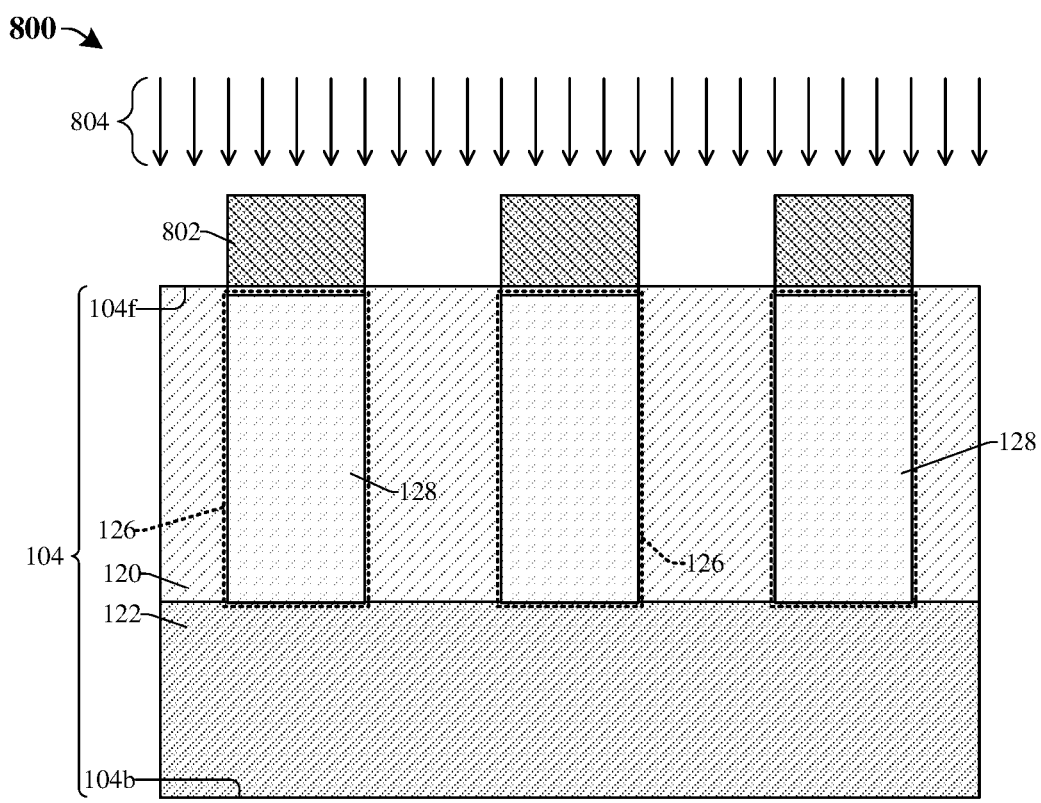

As illustrated in cross-sectional view 800 of FIG. 8, a second doped region 120 and a deep well region 122 are formed within the semiconductor substrate 104. In some embodiments, a process for forming the second doped region 120 and/or the deep well region 122 comprises: selectively forming a masking layer 802 over the front-side surface 104f; performing a selective ion implantation process according to the masking layer 802, thereby implanting a second dopant 804 within the semiconductor substrate 104 and forming the second doped region 120 and the deep well region 122; and performing a removal process to remove the masking layer 802 (not shown). The second dopant 804 may, for example, be or comprise gallium (e.g., $Ga^{+3}$) with a second doping type (e.g., p-type) and that has a low likelihood to diffuse out of the second doped region 120 and/or the deep well region 122 during subsequent processing steps and/or during operation of the photodetectors 126. Thus, the second doped region 120 and the deep well region 122 have the second doping type (e.g., p-type) that is opposite the first doping type (e.g., n-type). In further embodiments, the second doped region 120 and the deep well region 122 have a first doping concentration of the second dopant (e.g., gallium) ranging between about $10^{14}$ to $2*10^{18}$ atoms/$cm^3$, or another suitable value. Further, the second dopant has a sufficiently large atomic size (e.g., about 62 picometers (pm)), such that diffusion of the second dopant is mitigated and an area of the semiconductor substrate 104 the second doped region 120 and the deep well region 122 occupies is not increased. This maintains the size of the first doped regions 128 such that a volume of the photodetectors 126 is not decreased as the semiconductor substrate 104 is exposed to heat, thereby increasing and/or maintaining a full well capacity of the photodetectors 126.

In yet further embodiments, a diffusivity of the second dopant (e.g., gallium) at relatively high temperatures (e.g., about 700 degrees Celsius or greater) is relatively low (e.g., less than about $5.4*10^{-15}$ $cm^2/s$). This, in part, mitigates diffusion of the second dopant during subsequent front-end of line formation processes (e.g., see FIG. 9) and/or during operation of the image sensor 100. The relatively low diffusivity of the second dopant (e.g., gallium) is beneficial to high thermal budget products, especially compared to other dopants (e.g., boron) with high diffusivity at the relatively high temperatures, which have a low thermal budget resistance and are more likely to diffuse into the first doped regions 128 during subsequent processing steps. Thus, the second doped region 120 and the deep well region 122 have a high thermal budget resistance, thereby maintaining a size of the second doped region 120 and the deep well region 122 during subsequent processing steps.

Figure 9:
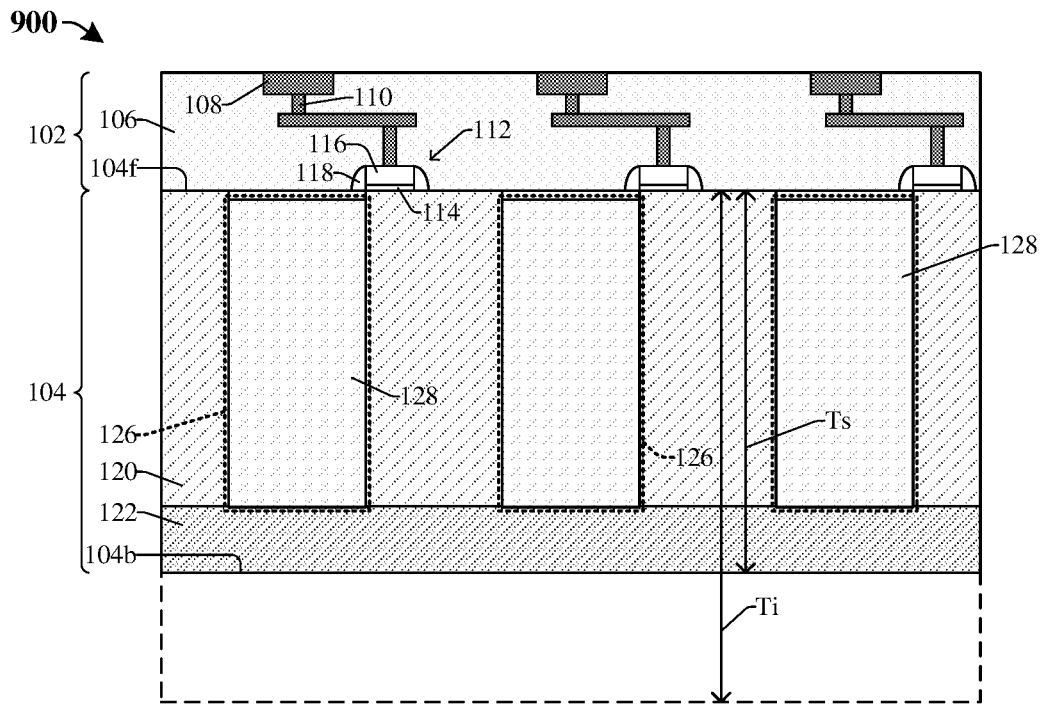

As illustrated in cross-sectional view 900 of FIG. 9, a plurality of pixel devices 112 and an interconnect structure 102 are formed along the front-side surface 104f of the semiconductor substrate 104. In some embodiments, each pixel device 112 comprises a gate dielectric layer 114, a gate electrode 116, and a sidewall spacer structure 118. The gate dielectric layer 114 is disposed between the gate electrode 116 and the semiconductor substrate 104. Further, the interconnect structure 102 comprises an interconnect dielectric structure 106, a plurality of conductive wires 108, and a plurality of conductive vias 110. In some embodiments, the interconnect dielectric structure 106 may be formed by one or more deposition processes such as a physical vapor deposition (PVD) process, a chemical vapor deposition (CVD) process, an atomic layer deposition (ALD) process, another suitable growth or deposition process, or any combination of the foregoing. In further embodiments, the plurality of conductive wires 108 and/or the plurality of conductive vias 110 may, for example, be formed by a single damascene process, a dual damascene process, or another suitable formation process. Furthermore, as illustrated in FIG. 9, a thinning process is performed on the semiconductor substrate 104 to reduce the semiconductor substrate 104 from an initial thickness Ti to a thickness Ts. The thinning process may, for example, include performing a chemical mechanical planarization (CMP) process, a mechanical grinding process, another suitable thinning process, or any combination of the foregoing.

Figure 10:
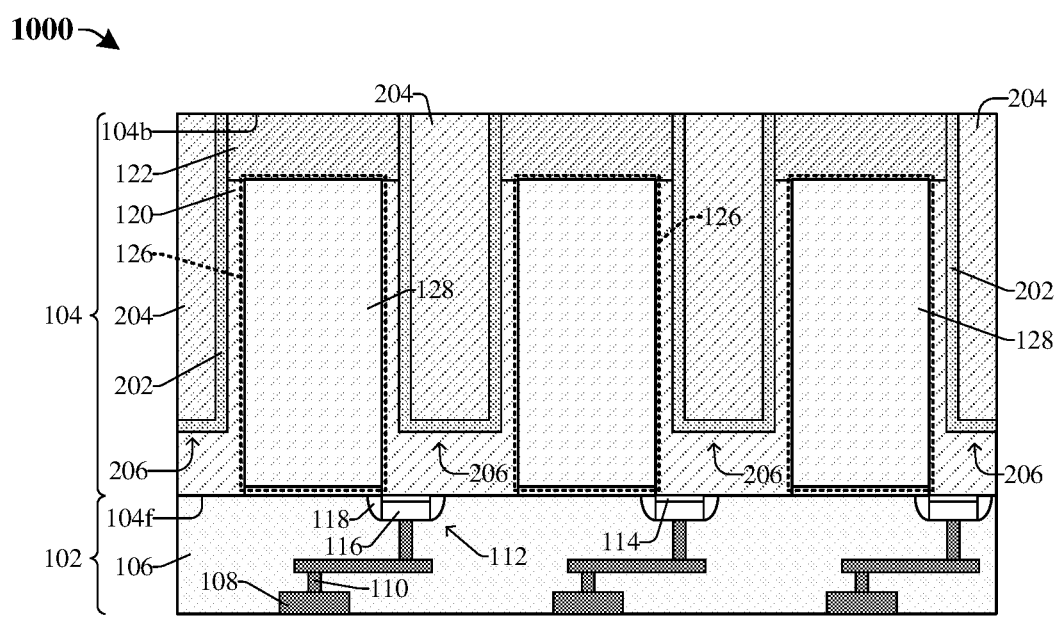

As illustrated in cross-sectional view 1000 of FIG. 10, an isolation structure 206 is formed into the back-side surface 104b of the semiconductor substrate 104. In some embodiments, the isolation structure 206 comprises a passivation layer 202 and a trench fill layer 204, where the passivation layer 202 is disposed between the semiconductor substrate 104 and the trench fill layer 204. In some embodiments, a process for forming the isolation structure 206 includes: selectively etching the back-side surface 104b of the semiconductor substrate 104 to form an isolation structure opening with the semiconductor substrate 104; depositing (e.g., by CVD, PVD, ALD, etc.) the passivation layer 202 over the semiconductor substrate 104, thereby lining the isolation structure opening; depositing (e.g., by CVD, PVD, ALD, etc.) the trench fill layer 204 over the passivation layer 202; and performing a planarization process into the passivation layer 202 and the trench fill layer 204, thereby forming the isolation structure 206.

Figure 11:
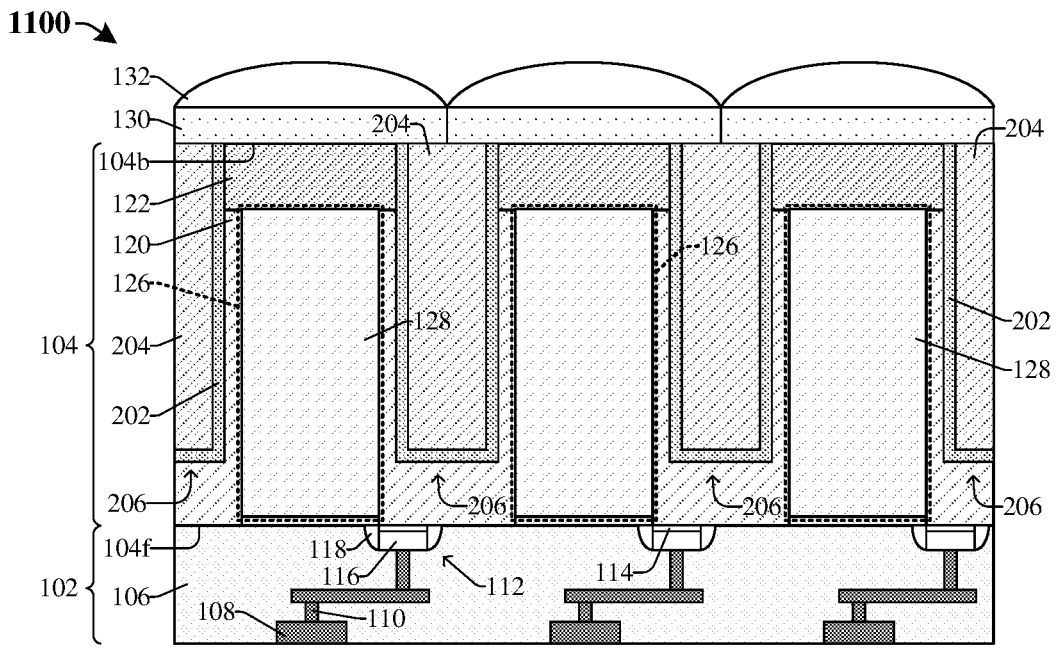

As illustrated in cross-sectional view 1100 of FIG. 11, a plurality of light filters 130 (e.g., color filters) are formed over the back-side surface 104b of the semiconductor substrate 104 and the isolation structure 206. Further, a plurality of micro-lenses 132 are formed over the plurality of light filters 130. In some embodiments, the light filters 130 and the micro-lenses 132 may be deposited by, for example, CVD, PVD, ALD, or another suitable deposition or growth process.

FIGS. 12-22 illustrate cross-sectional views 1200-2200 of some embodiments of a second method of forming an image sensor comprising a plurality of photodetectors having first doped regions and a second doped region laterally surrounding the first doped regions, where the second doped region comprises a second dopant configured to improve full well capacity of the photodetectors, according to the present disclosure. Although the cross-sectional views 1200-2200 shown in FIGS. 12-22 are described with reference to the second method, it will be appreciated that the structures shown in FIGS. 12-22 are not limited to the second method but rather may stand alone separate of the second method. Furthermore, although FIGS. 12-22 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 12:
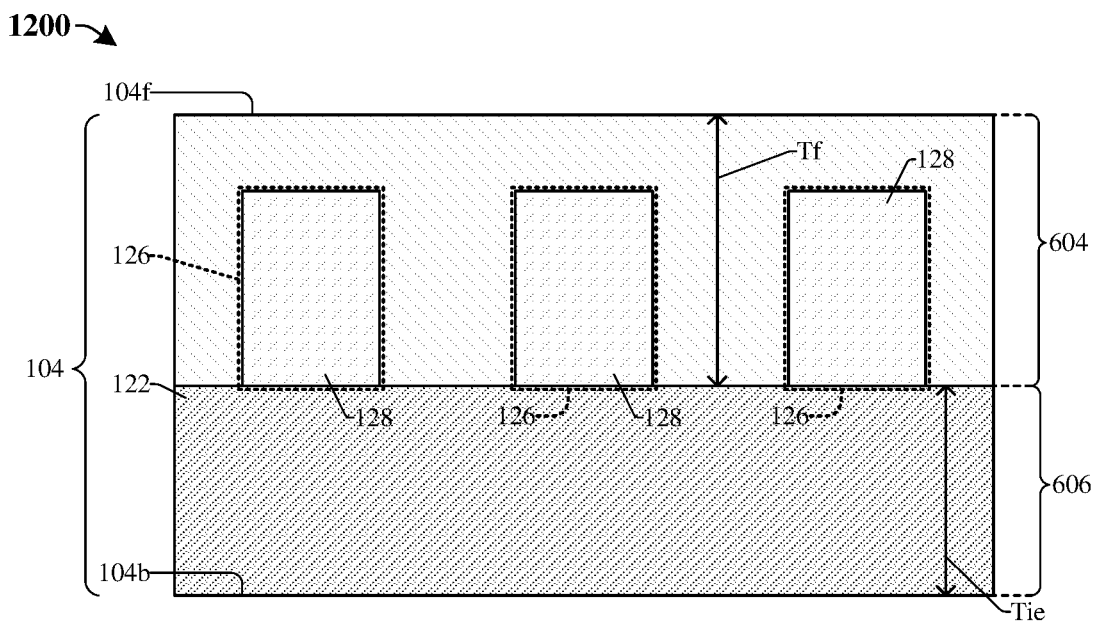
FIGS. 12-22 illustrate cross-sectional views of some embodiments of a second method of forming an image sensor comprising a plurality of photodetectors having first doped regions and a second doped region laterally surrounding the first doped regions, where the second doped region comprises a second dopant configured to improve full well capacity of the photodetectors.

As illustrated in cross-sectional view 1200 of FIG. 12, a plurality of photodetectors 126 are formed within a semiconductor substrate 104. The plurality of photodetectors 126 respectively comprise a first doped region 128 disposed within the semiconductor substrate 104, where the first doped region 128 comprises a first doping type (e.g., n-type). In some embodiments, the semiconductor substrate 104 may be or comprise any type of semiconductor body (e.g., silicon/germanium/CMOS bulk, SiGe, SOI, etc.) such as a semiconductor wafer or one or more die on a wafer, as well as any other type of semiconductor and/or epitaxial layers otherwise associated therewith. For example, the semiconductor substrate 104 may be or comprise a first epitaxial layer 604 overlying a second epitaxial layer 606. In some embodiments, the first epitaxial layer 604 may be or comprise a p-type epitaxial silicon layer having a thickness Tf of about 5.4 micrometers (um), about 6 um, within a range of about 5.4 to 6 um, or another suitable value. In yet further embodiments, the first epitaxial layer 604 may be or comprise an n-type epitaxial silicon layer having a thickness Tf of about 11 um, within a range of about 10.5 to 11.5 um, or another suitable value. In further embodiments, the second epitaxial layer 606 may be or comprise a p-type epitaxial silicon layer having an initial thickness Tie within a range of about 4 to 11 um, or another suitable value. The first epitaxial layer 604 may, for example, be formed by p-type epitaxial process, an n-type epitaxial process, or another suitable epitaxial process. In yet further embodiments, the first and second epitaxial layers 604, 606 are crystalline silicon.

In some embodiments, the first epitaxial layer 604 and/or the second epitaxial layer 606 each comprise a second dopant (e.g., gallium) having a second doping type (e.g., p-type) opposite the first doping type (e.g., n-type). In some embodiments, a doping concentration of the first epitaxial layer 604 may, for example, be within a range of about $10^{14}$ to $5*10^{15}$ atoms/cm$^3$, or another suitable value. Further, a deep well region 122 is formed within the second epitaxial layer 606, the deep well region 122 may be formed by a selective ion implantation process, or another suitable process. In some embodiments, the deep well region 122 comprises the second dopant (e.g., gallium) with a doping concentration within a range of about $10^{14}$ to $2*10^{18}$ atoms/cm$^3$, or another suitable value. In various embodiments, a process for forming the plurality of photodetectors 126 includes: selectively forming a masking layer (not shown) over a front-side surface 104f of the semiconductor substrate 104; performing a selective implantation process according to the masking layer, thereby implanting one or more dopants within the semiconductor substrate 104 and forming the first doped regions 128; and performing a removal process to remove the masking layer (not shown). The one or more dopants may, for example, be or comprise phosphorus, arsenic, antimony, another suitable n-type dopant, or any combination of the foregoing with the first doping type (e.g., n-type).

Figure 13:
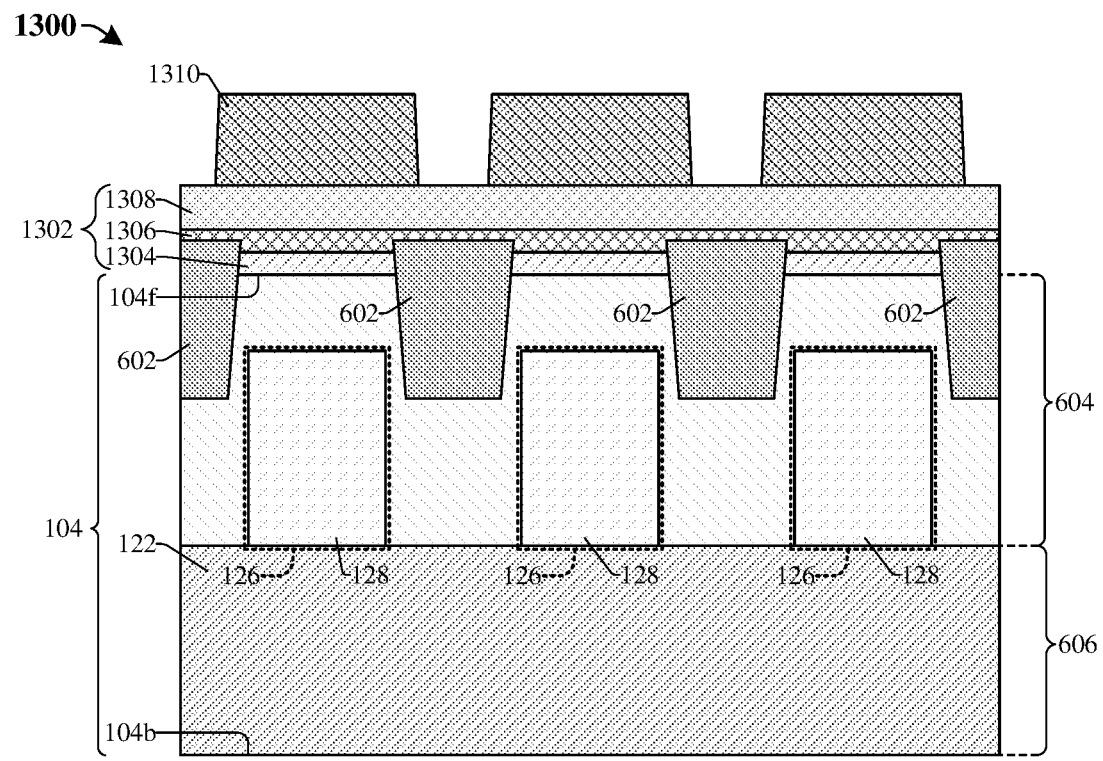

As illustrated in cross-sectional view 1300 of FIG. 13, a masking layer 1302 is formed over the front-side surface 104f of the semiconductor substrate 104, a shallow trench isolation (STI) structure 602 is formed within the semiconductor substrate 104 and the masking layer 1302, and a photoresist structure 1310 is formed over the masking layer 1302. In some embodiments, the masking layer 1302 comprises a first dielectric layer 1304, a second dielectric layer 1306, and a third dielectric layer 1308. In some embodiments, the masking layer 1302 is formed by multiple deposition processes such as one or more PVD processes, CVD processes, ALD processes, thermal oxidation processes, other suitable deposition or growth processes, or any combination of the foregoing. The first dielectric layer 1304 may, for example, be or comprise silicon dioxide, another suitable dielectric material and may be formed to a thickness of about 90 angstroms, or another suitable thickness value. The second dielectric layer 1306 may, for example, be or comprise silicon nitride, or another suitable dielectric material and may be formed to a thickness of about 800 angstroms, or another suitable thickness value. The third dielectric layer 1308 may, for example, be or comprise a layer of silicon dioxide, or another suitable dielectric material formed to a thickness of about 270 angstroms and a layer of silicon oxynitride, or another suitable dielectric material formed to a thickness of about 3,000 angstroms. It will be appreciated that layers of the third dielectric layer 1308 having other thickness values is within the scope of the disclosure.

In some embodiments, a process for forming the STI structure 602 may comprise: selectively etching the semiconductor substrate 104, the first dielectric layer 1304, and the second dielectric layer 1306 to form an STI opening; depositing (e.g., by CVD, PVD, ALD, etc.) a dielectric material (e.g., silicon dioxide, silicon nitride, silicon carbide, silicon oxynitride, silicon oxycarbide, etc.) within the STI opening; and performing a planarization process (e.g., a CMP process) and/or an etch back process on the dielectric material, thereby forming the STI structure 602. Further, in some embodiments, the photoresist structure 1310 comprises a photoresist formed to a thickness of about 6900 angstroms and an anti-reflective layer formed to a thickness of about 800 angstroms. It will be appreciated that layers of the photoresist structure 1310 having other thickness values is within the scope of the disclosure. The photoresist structure 1310 may, for example, be deposited by a PVD process, a CVD process, an ALD process, a spin-on process, another suitable growth or deposition process, or any combination of the foregoing.

Figure 14:
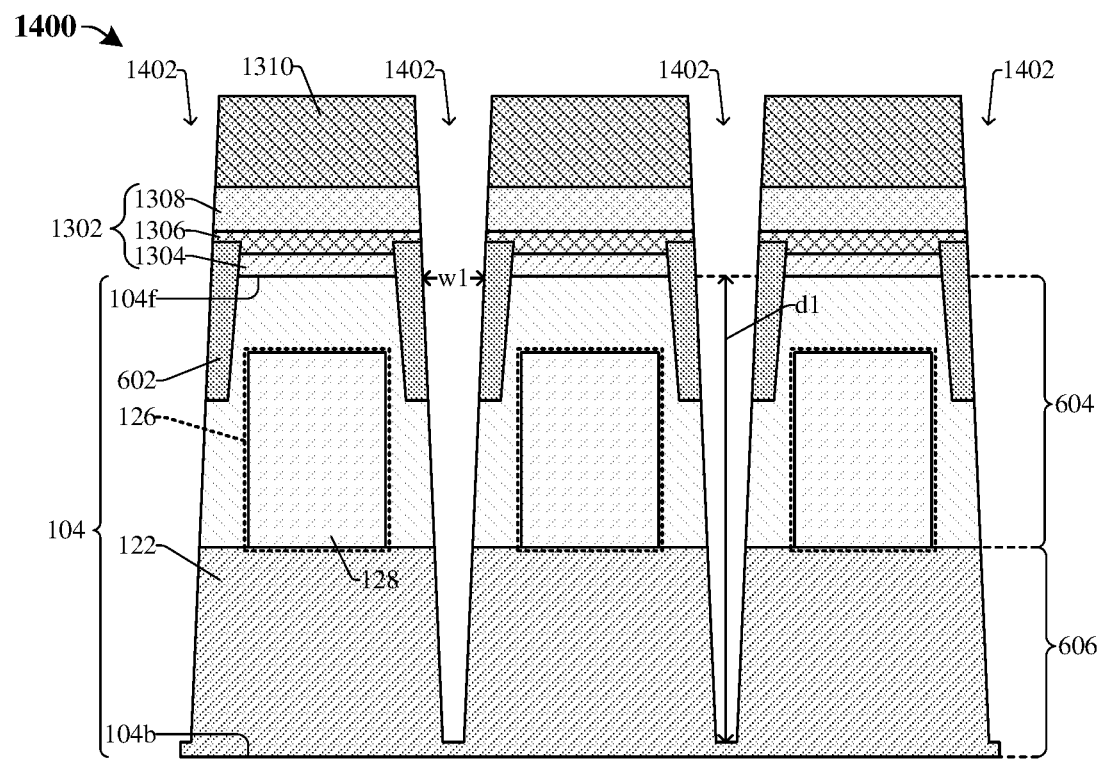

As illustrated in cross-sectional view 1400 of FIG. 14, a patterning process is performed on the masking layer 1302, the STI structure 602, and the semiconductor substrate 104, thereby forming an isolation structure opening 1402 within the semiconductor substrate 104. In some embodiments, the patterning process may include performing a wet etch process, a dry etch process, another suitable etch process, or any combination of the foregoing. The isolation structure opening 1402 extends a distance d1 into the front-side surface 104f of the semiconductor substrate 104 and has a width w1. In some embodiments, the distance d1 is about 7 um, 8 um, 9 um, 10 um, within a range of about 7 to 10 um, or another suitable value. In further embodiments, the width w1 is about 0.3 um, within a range of about 0.25 to 0.35 um, or another suitable value.

Figure 15:
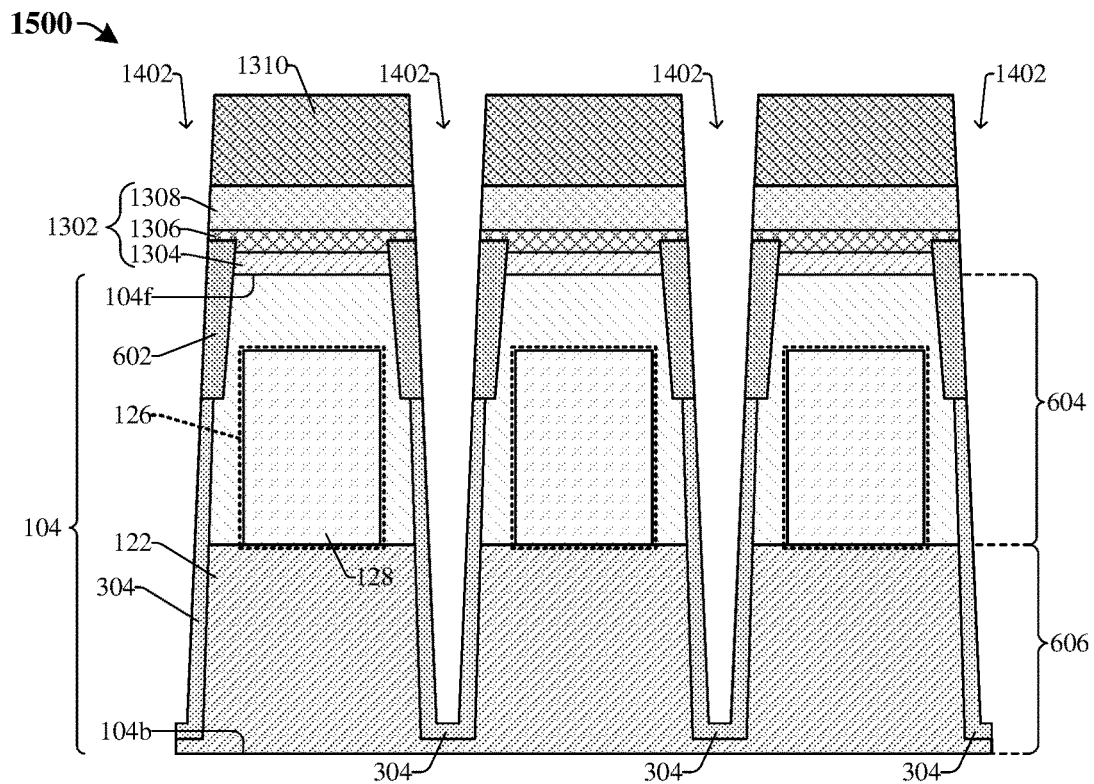

As illustrated in cross-sectional view 1500 of FIG. 15, a doped liner 304 is formed along sidewalls and a lower surface of the semiconductor substrate 104 that define the isolation structure opening 1402. In yet further embodiments, the doped liner 304 may be referred to as a doped region of the semiconductor substrate 104. In some embodiments, a process for forming the doped liner 304 may comprise performing a plasma doping process according to the photoresist structure 1310, thereby doping sidewalls and a lower surface of the semiconductor substrate 104 with the second dopant (e.g., gallium). In yet further embodiments, the plasma doping process is performed such that crystalline regions of the semiconductor substrate 104 are amorphized, thus the doped liner 304 comprises amorphous silicon doped with the second dopant (e.g., gallium). The second dopant may, for example, be or comprise gallium having the second doping type (e.g., p-type). In some embodiments, the doped liner 304 comprises the second dopant and has a doping concentration of the second dopant ranging between about $10^{14}$ to $2*10^{18}$ atoms/cm$^3$, $5*10^{15}$ to $2*10^{18}$ atoms/cm$^3$ or another suitable value. In various embodiments, the doping concentration of the second dopant of the doped liner 304 adjacent the first epitaxial layer 604 might be more than the concentration of the second dopant of the doped liner 304 adjacent the second epitaxial layer 606, due to the second dopant originally existing in the first epitaxial layer 604. Accordingly, the doping concentration of the second dopant of the upper doped liner 304 might be more than that of the adjacent first epitaxial layer 604 (more than $10^{14}$ atoms/$cm^3$), while the concentration of the second dopant of the lower doped liner 304 adjacent the second epitaxial layer 606 is about $10^{14}$ atoms/$cm^3$. In yet further embodiments, a thickness of the doped liner 304 is greater than about 10 nanometers (nm) or another suitable thickness value. In yet further embodiments, the doped liner 304 extends along sidewalls of the STI structure 602, sidewalls of the mask layer 1302, and/or sidewalls of the photoresist structure 1310 that define the isolation structure opening 1402 (not shown).

Figure 16:
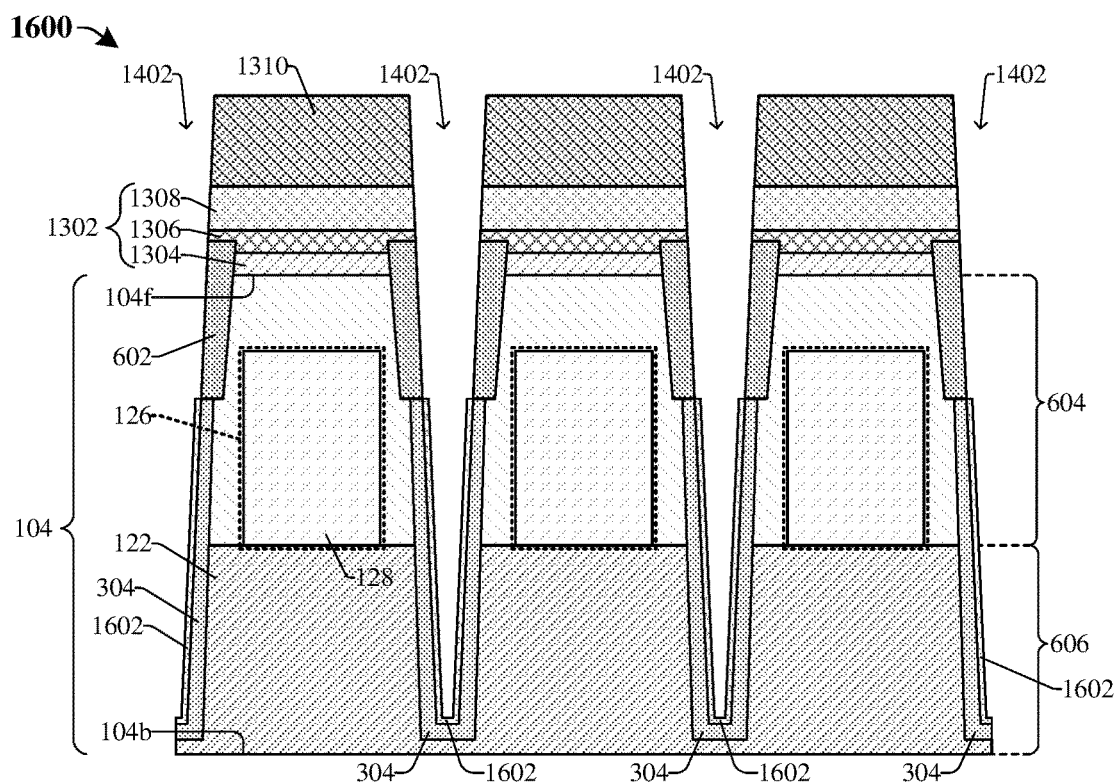

As illustrated in cross-sectional view 1600 of FIG. 16, an oxidation process is performed on the doped liner 304, such that a doped dielectric layer 1602 is formed along sidewalls and the lower surface of the semiconductor substrate 104 that define the isolation structure opening 1402. In some embodiments, the doped dielectric layer 1602 comprises silicon dioxide doped with the second dopant (e.g., gallium). In yet further embodiments, at least a portion of the doped liner 304 is converted to silicon dioxide doped with the second dopant by the oxidation process. In some embodiments, the oxidation process includes performing an in-situ steam generation (ISSG) process or another suitable oxidation process. In yet further embodiments, the oxidation process may cure defects (e.g., crystalline defects) along the sidewalls and the lower surface of the semiconductor substrate 104 as a result of the plasma doping process of FIG. 15.

Figure 17:
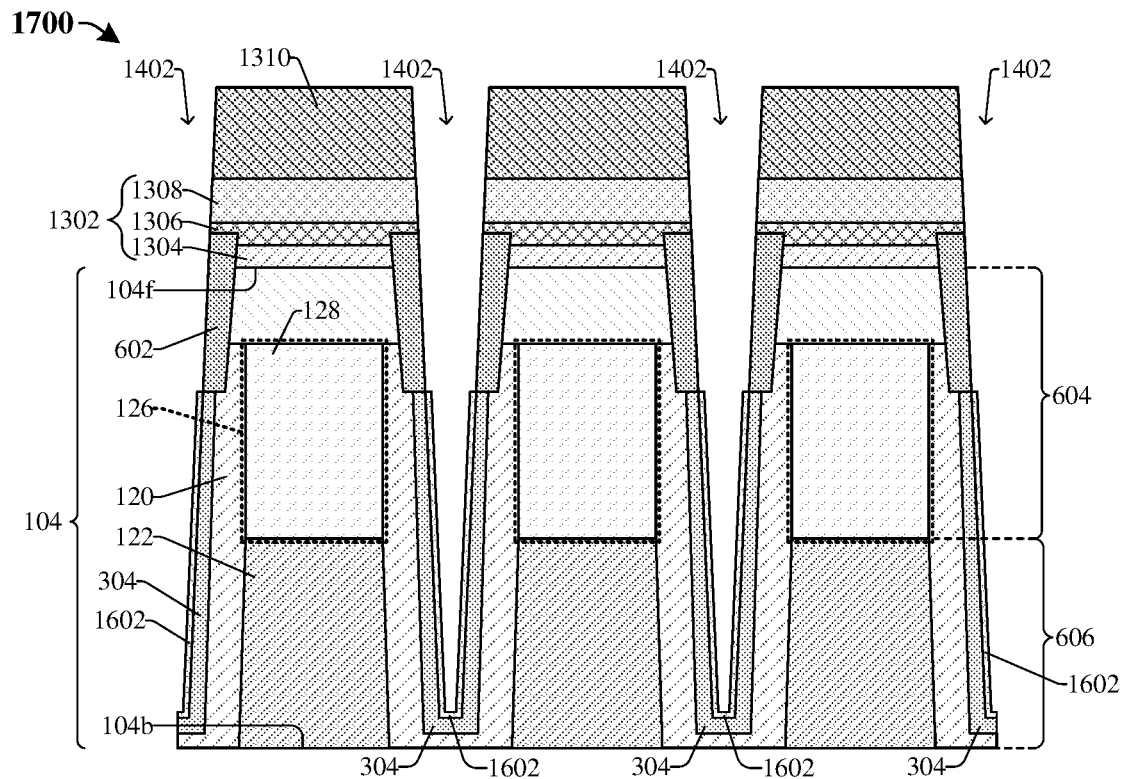

As illustrated in cross-sectional view 1700 of FIG. 17, an annealing process is performed on the semiconductor substrate 104, thereby forming a second doped region 120 within the semiconductor substrate 104. In some embodiments, the second doped region 120 comprises the second dopant (e.g., gallium) and has a doping concentration within a range of about $10^{14}$ to $2*10^{18}$ atoms/$cm^3$. In yet further embodiments, the annealing process may drive the second dopant (e.g., gallium) from the doped liner 304 and/or the doped dielectric layer 1602 into the semiconductor substrate 104 to form the second doped region 120, such that the second doped region 120 is self-aligned along the isolation structure opening 1402. In various embodiments, the annealing process drives the second dopant (e.g., gallium) a distance of at least 10 nm from the doped liner 304 into the semiconductor substrate 104. It will be appreciated that the annealing process driving the second dopant other distance values into the semiconductor substrate 104 is within the scope of the disclosure. The annealing process is performed by exposing the semiconductor substrate 104 to an elevated temperature that is, for example, within a range of about 500 to 950 degrees Celsius, or another suitable value. Further, the annealing process may cure crystalline defects and/or activate the second dopant (e.g. gallium) within the semiconductor substrate 104. In yet further embodiments, the annealing process may convert the amorphous silicon within the doped liner 304 into crystalline silicon, such that the doped liner 304 and the second doped region 120 are one and the same.

Figure 18:
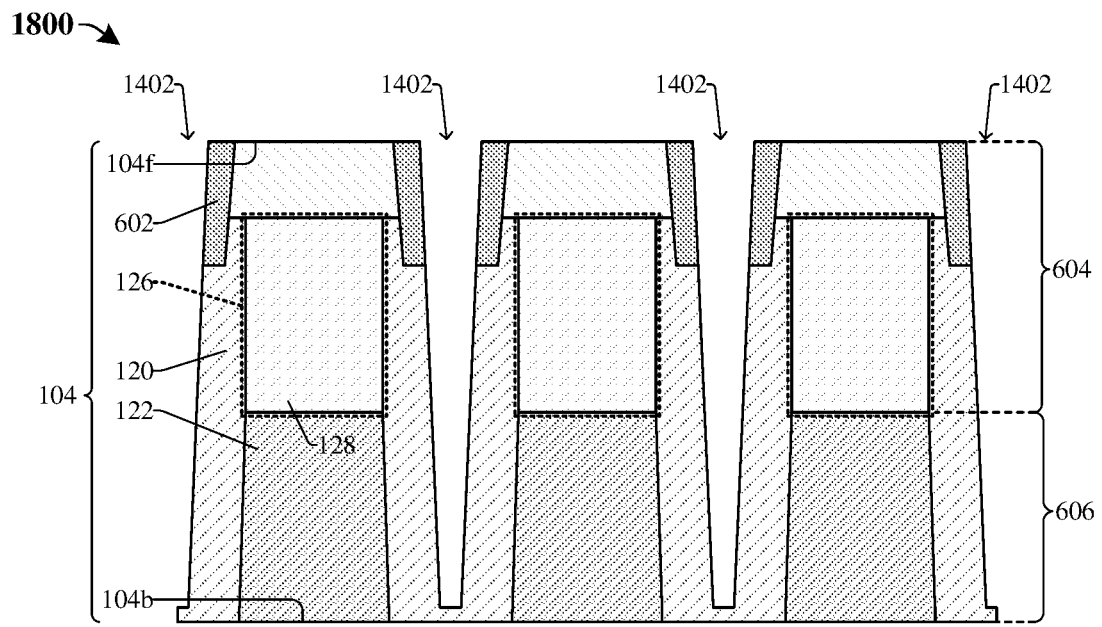

As illustrated in cross-sectional view 1800 of FIG. 18, a removal process is performed to remove the doped dielectric layer (1602 of FIG. 17). In some embodiments, the removal process includes performing a wet etch process and exposing the semiconductor substrate 104 to a wet etchant such as hydrofluoric acid. In various embodiments, the removal process is configured to remove the doped dielectric layer (1602 of FIG. 17) (e.g., silicon dioxide) and may remove at least a portion of the doped liner (304 of FIG. 17) that comprises silicon dioxide. In some embodiments, the doped liner 304 might remain, and the doped liner 304 and the second doped region 120 are substantially the same material so the doped liner 304 is not additionally marked. Further, a planarization process (e.g., a CMP process) and/or an etch back process is performed on the semiconductor substrate 104 to remove the photoresist structure (1310 of FIG. 17) and/or the masking layer (1302 of FIG. 17).

Figure 19:
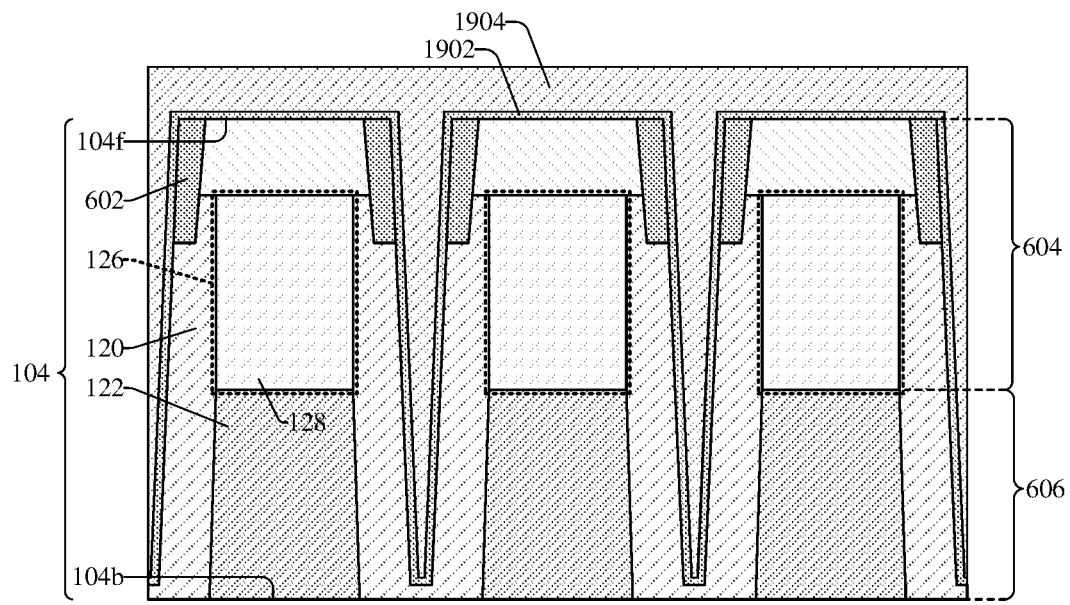

As illustrated in cross-sectional view 1900 of FIG. 19, a passivation film 1902 is deposited over the front-side surface 104f of the semiconductor substrate 104 and lines the isolation structure opening (1402 of FIG. 18). Further, a trench fill structure 1904 is deposited over the passivation film 1902 and fills a remaining portion of the isolation structure opening (1402 of FIG. 18). In some embodiments, the passivation film 1902 and/or the trench fill structure 1904 are respectively deposited by CVD, PVD, ALD, or another suitable deposition or growth process. In some embodiments, the passivation film 1902 may, for example, be or comprise aluminum oxide ($Al_2O_3$), hafnium oxide ($HfO_2$), titanium oxide ($Ta_2O_5$), another high-k dielectric material, any combination of the foregoing, or the like. The trench fill structure 1904 may, for example, be or comprise silicon dioxide, silicon nitride, silicon carbide, another dielectric material, or any combination of the foregoing.

Figure 20:
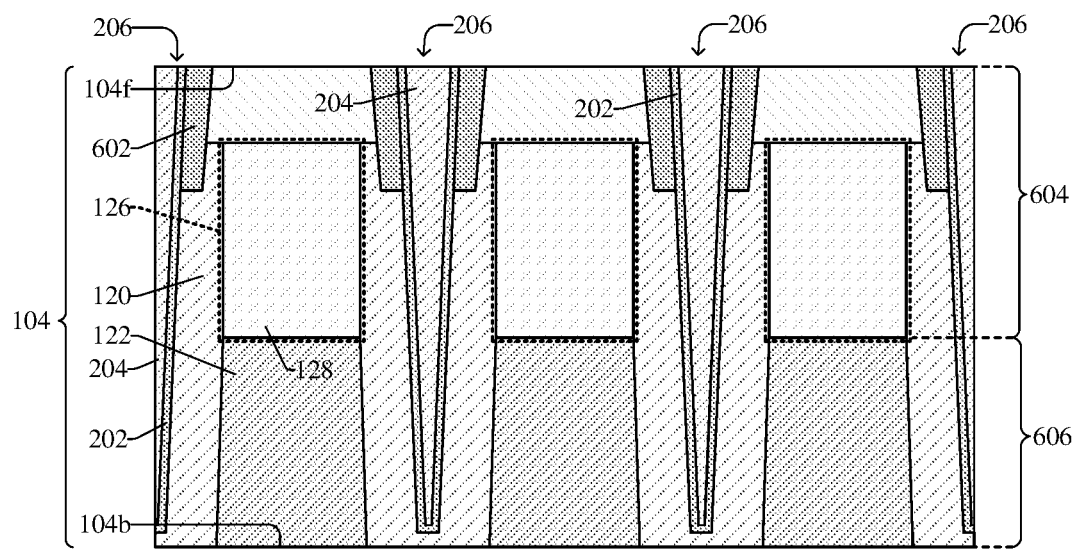

As illustrated in cross-sectional view 2000 of FIG. 20, a planarization process (e.g., a CMP process) is performed into the passivation film (1902 of FIG. 19) and the trench fill structure (1904 of FIG. 19), thereby forming a passivation layer 202 and a trench fill layer 204, respectively. Further, the planarization process forms an isolation structure 206 that extends from the front-side surface 104f of the semiconductor substrate 104 to a point below the front-side surface 104f. In some embodiments, the isolation structure 206 is disposed between adjacent photodetectors 126 and comprises the passivation layer 202, the trench fill layer 204, and the STI structure 602.

Figure 21:
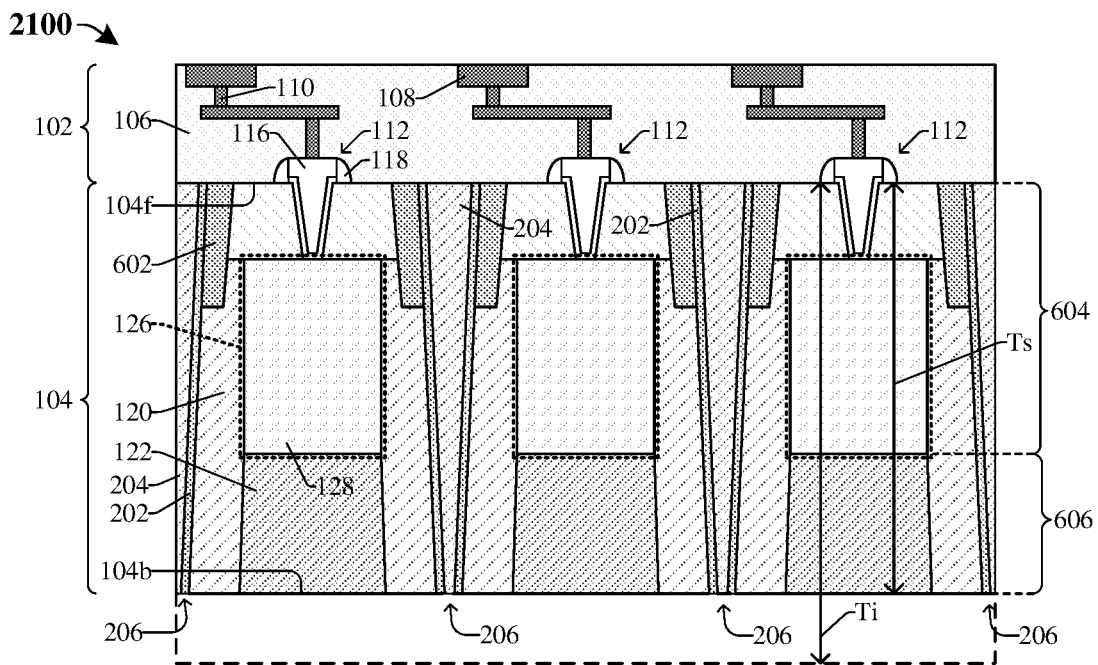

As illustrated in cross-sectional view 2100 of FIG. 21, a plurality of pixel devices 112 and an interconnect structure 102 are formed along the front-side surface 104f of the semiconductor substrate 104. In some embodiments, the interconnect structure 102 is formed as illustrated and/or described in FIG. 9. Further, as illustrated in FIG. 21, a thinning process is performed on the semiconductor substrate 104 to reduce the semiconductor substrate 104 from an initial thickness Ti to a thickness Ts. The thinning process may, for example, include performing a CMP process, a mechanical grinding process, another suitable thinning process, or any combination of the foregoing. In some embodiments, the thinning process removes at least a portion of the isolation structure 206 and/or at least a portion of the second epitaxial layer 606.

Figure 22:
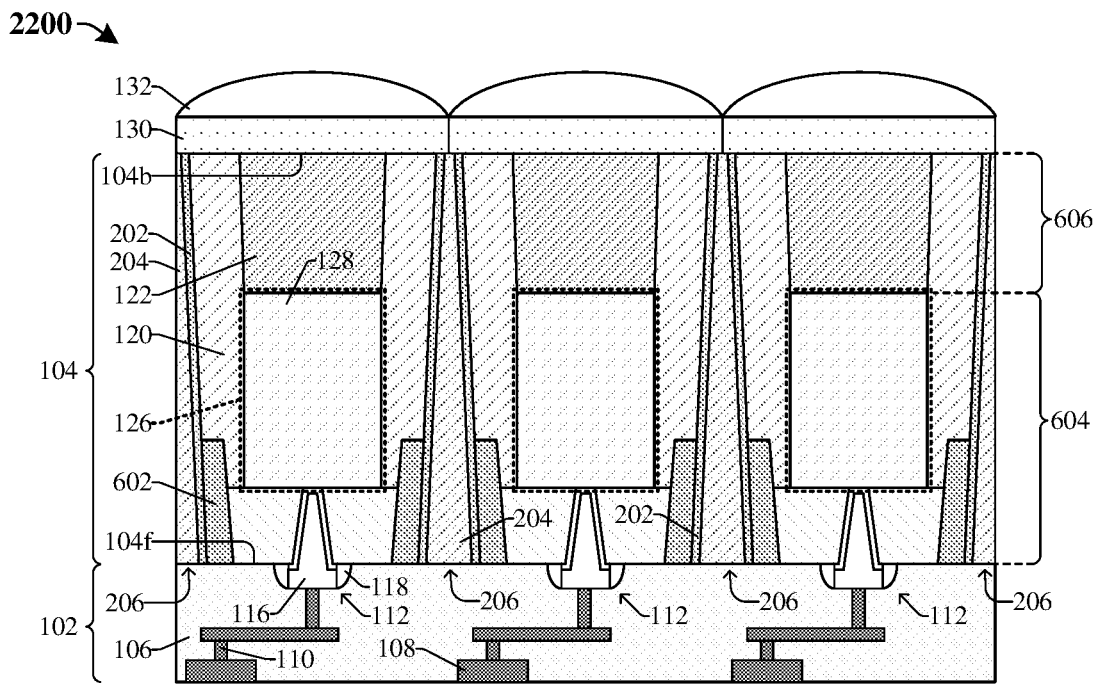

As illustrated in cross-sectional view 2200 of FIG. 22, a plurality of light filters 130 (e.g., color filters) are formed over the back-side surface 104b of the semiconductor substrate 104 and the isolation structure 206. Further, a plurality of micro-lenses 132 are formed over the plurality of light filters 130. In some embodiments, the light filters 130 and the micro-lenses 132 may be deposited by, for example, CVD, PVD, ALD, or another suitable deposition or growth process.

FIGS. 23-26 illustrate cross-sectional views 2300-2600 of a second embodiment of the second method of FIGS. 12-22. For example, FIGS. 23-26 illustrates cross-sectional views 2300-2600 of some alternative embodiments of acts that may be performed in place of the acts at FIGS. 15-18, such that the second method of FIGS. 12-22 may alternatively proceed from FIGS. 12-14 to FIG. 23, FIG. 23 to FIGS. 24-26, and then from FIG. 26 to FIGS. 19-22 (i.e., skipping FIGS. 15-18).

Figure 23:
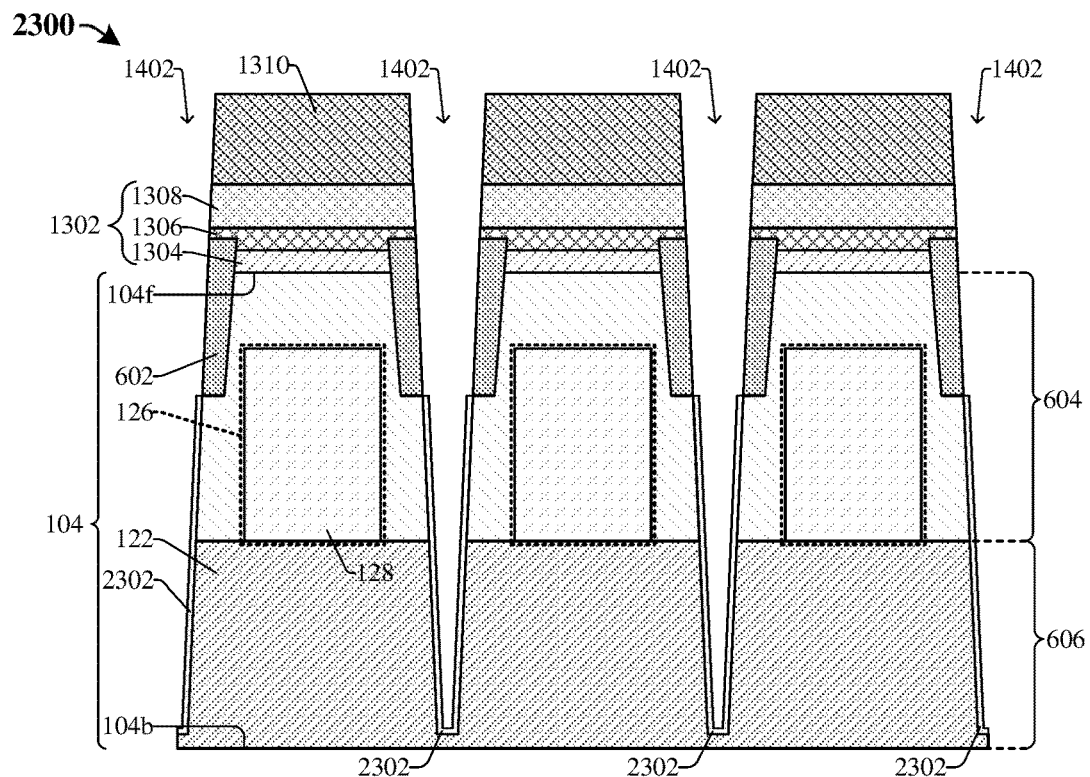
FIGS. 23-26 illustrate cross-sectional views of some alternative embodiments of the second method of FIGS. 12-22.

As illustrated in cross-sectional view 2300 of FIG. 23, a dielectric layer 2302 is formed along sidewalls and the lower surface of the semiconductor substrate 104. In some embodiments, the dielectric layer 2302 is formed by CVD, PVD, thermal oxidation, in-situ steam generation (ISSG), or another suitable deposition or growth process. In some embodiments, the dielectric layer 2302 is formed by an oxidation process (e.g., such as an ISSG process), that may cure defects (e.g., crystalline defects) along the sidewalls and the lower surface of the semiconductor substrate 104 as a result of the patterning process of FIG. 14. In various embodiments, the dielectric layer 2302 may be or comprise an oxide, such as silicon dioxide, another suitable dielectric material, or the like. In yet further embodiments, the dielectric layer 2302 may be referred to as a protection layer that is configured to mitigate damage to the semiconductor substrate 104 during subsequent processing steps (e.g., the plasma doping process of FIG. 24).

Figure 24:
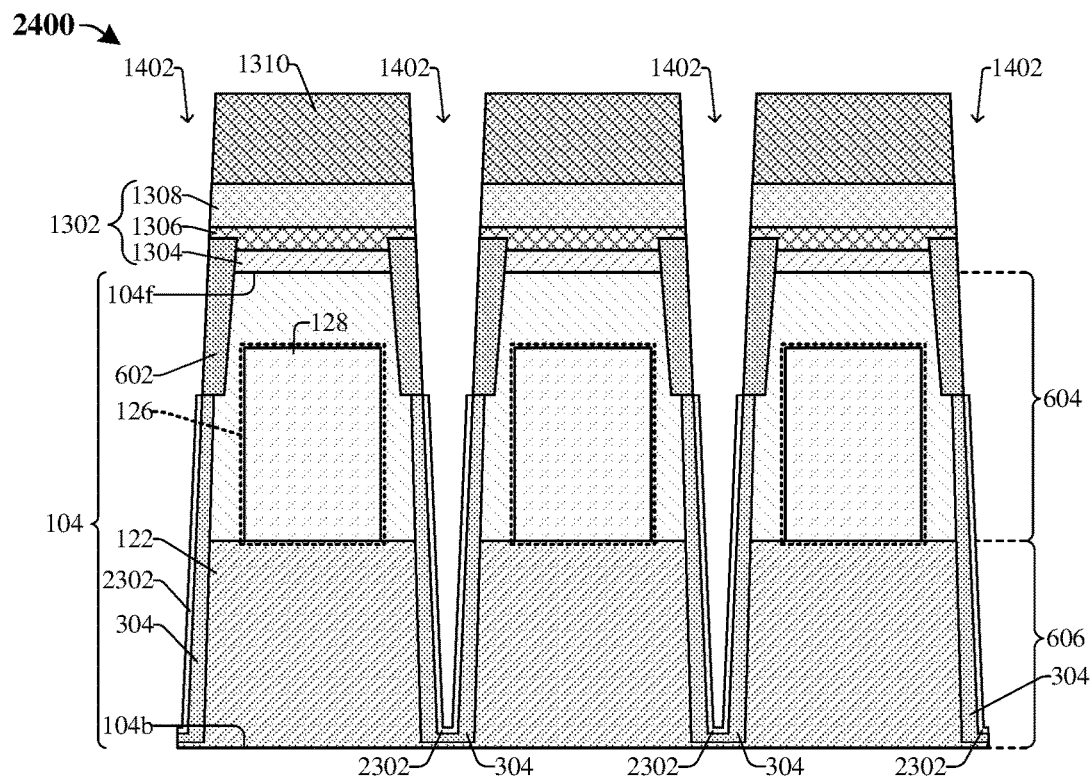

As illustrated in cross-sectional view 2400 of FIG. 24, a doped liner 304 is formed under the dielectric layer 2302. The doped liner 304 may be formed by a plasma doping process. In yet further embodiments, the doped liner 304 comprises the second dopant (e.g., gallium) and is formed to a thickness greater than 10 nm, or another suitable thickness value. In further embodiments, after the plasma doping process, the dielectric layer 2302 may comprise the second dopant (e.g., gallium). The second dopant may, for example, be or comprise gallium having the second doping type (e.g., p-type). In some embodiments, the doped liner 304 has a doping concentration of the second dopant ranging between about $10^{14}$ to $2*10^{18}$ atoms/cm$^3$ or another suitable value. In yet further embodiments, the doped liner 304 may be or comprise amorphous silicon doped with the second dopant.

Figure 25:
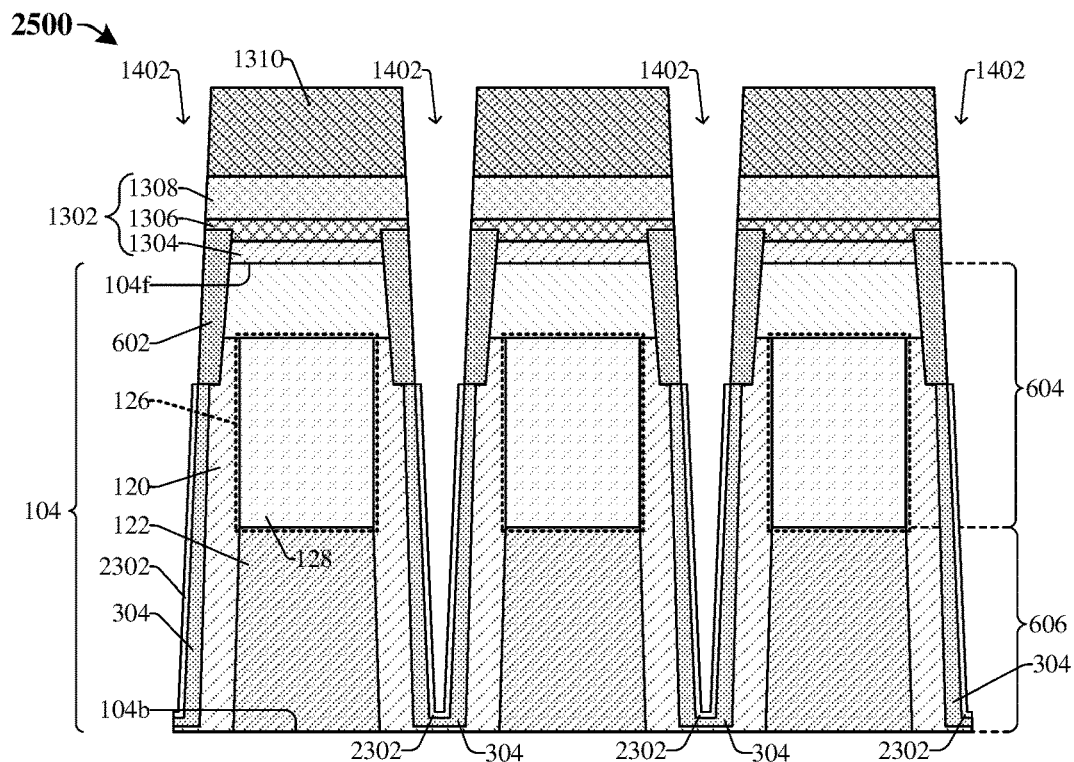

As illustrated in cross-sectional view 2500 of FIG. 25, an annealing process is performed on the semiconductor substrate 104, thereby forming a second doped region 120 within the semiconductor substrate 104. In some embodiments, the second doped region 120 comprises the second dopant (e.g., gallium) and has a doping concentration within a range of about $10^{14}$ to $2*10^{18}$ atoms/cm$^3$, or another suitable value. In yet further embodiments, the annealing process drives the second dopant (e.g., gallium) from the doped liner (304 of FIG. 24) and/or the dielectric layer 2302 into the semiconductor substrate 104 to form the second doped region 120, such that the second doped region 120 is self-aligned along the isolation structure opening 1402. In various embodiments, the annealing process drives the second dopant (e.g., gallium) a distance of at least 10 nm from the doped liner 304 into the semiconductor substrate 104. It will be appreciated that the annealing process driving the second dopant other distance values into the semiconductor substrate 104 is within the scope of the disclosure. The annealing process is performed by exposing the semiconductor substrate 104 to an elevated temperature that is, for example, within a range of about 500 to 950 degrees Celsius, or another suitable value. Further, the annealing process may cure crystalline defects and/or activate the second dopant (e.g. gallium) within the semiconductor substrate 104. In yet further embodiments, the annealing process may convert the amorphous silicon within the doped liner 304 into crystalline silicon, such that the doped liner 304 and the second doped region 120 are one and the same.

Figure 26:
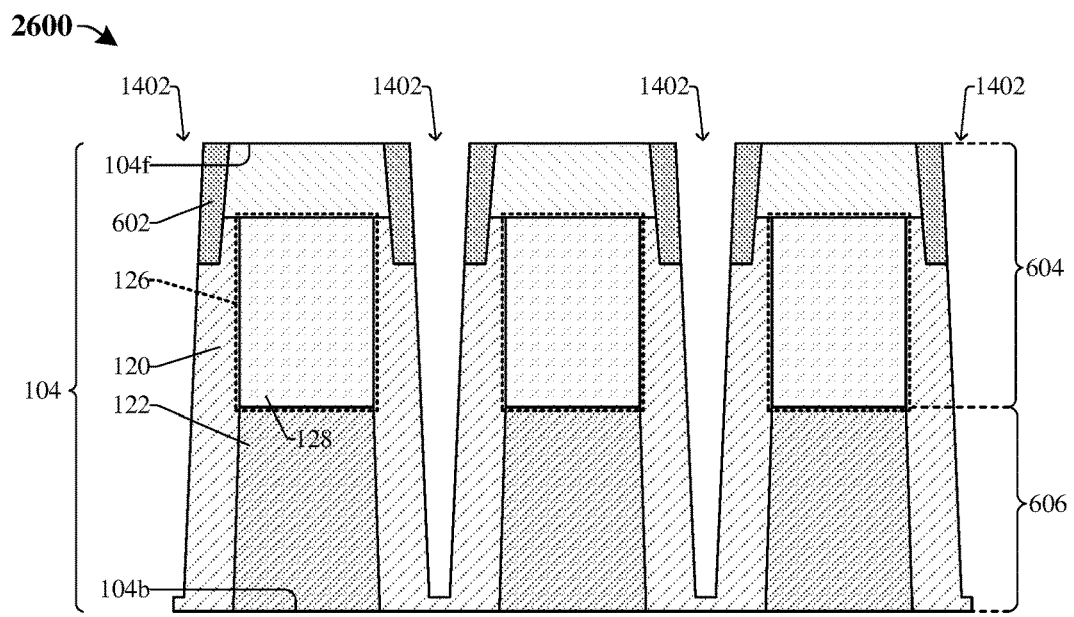

As illustrated in cross-sectional view 2600 of FIG. 26, a removal process is performed to remove the dielectric layer (2302 of FIG. 25). In some embodiments, the removal process includes performing a wet etch process and exposing the semiconductor substrate 104 to a wet etchant such as hydrofluoric acid. Further, a planarization process (e.g., a CMP process) and/or an etch back process is performed on the semiconductor substrate 104 to remove the photoresist structure (1310 of FIG. 25) and/or the masking layer (1302 of FIG. 25).

FIGS. 27-31 illustrate cross-sectional views 2700-3100 of a third embodiment of the second method of FIGS. 12-22. For example, FIGS. 27-31 illustrates cross-sectional views 2700-3100 of some alternative embodiments of acts that may be performed in place of the acts at FIGS. 15-20, such that the second method of FIGS. 12-22 may alternatively proceed from FIGS. 12-14 to FIG. 27, FIG. 27 to FIGS. 28-31, and then from FIG. 31 to FIGS. 21-22 (i.e., skipping FIGS. 15-20).

Figure 27:
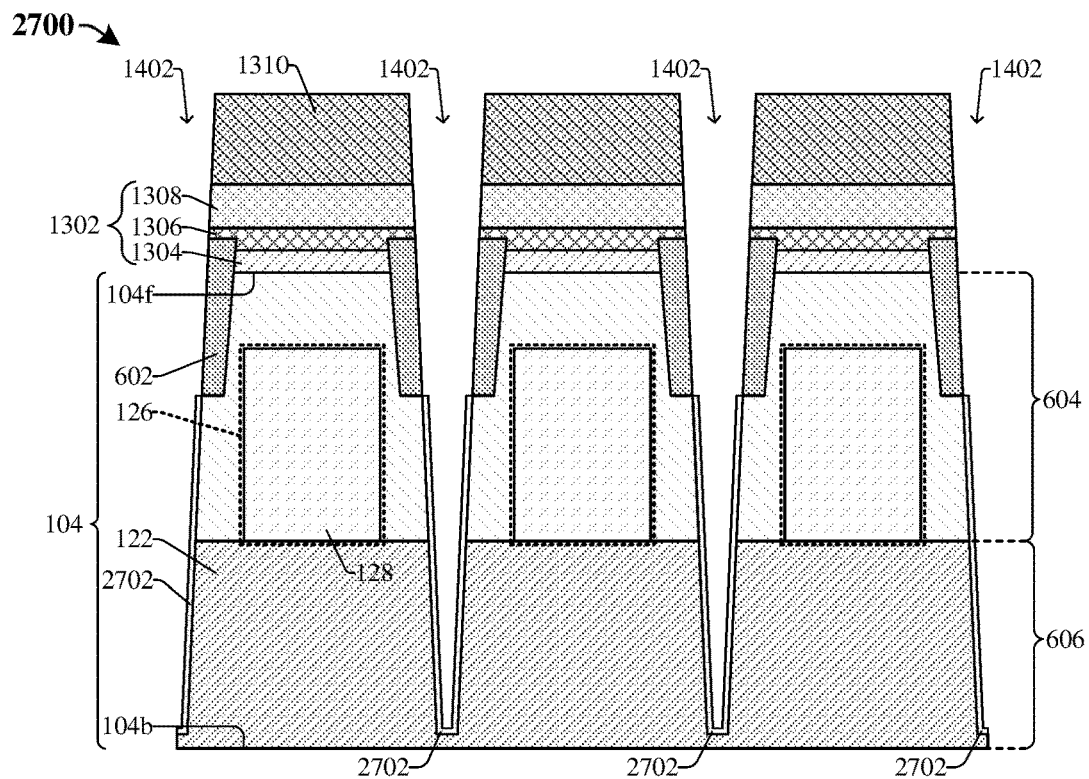
FIGS. 27-31 illustrate cross-sectional views of some additional alternative embodiments of the second method of FIGS. 12-22.

As illustrated in cross-sectional view 2700 of FIG. 27, a dielectric layer 2702 is formed along sidewalls and the lower surface of the semiconductor substrate 104. In some embodiments, the dielectric layer 2702 is formed by CVD, PVD, thermal oxidation, in-situ steam generation (ISSG), or another suitable deposition or growth process. In some embodiments, the dielectric layer 2702 is formed by an oxidation process (e.g., such as an ISSG process), that may cure defects (e.g., crystalline defects) along the sidewalls and the lower surface of the semiconductor substrate 104 as a result of the patterning process of FIG. 14. In various embodiments, the dielectric layer 2702 may be or comprise an oxide, such as silicon dioxide, another suitable dielectric material, or the like.

Figure 28:
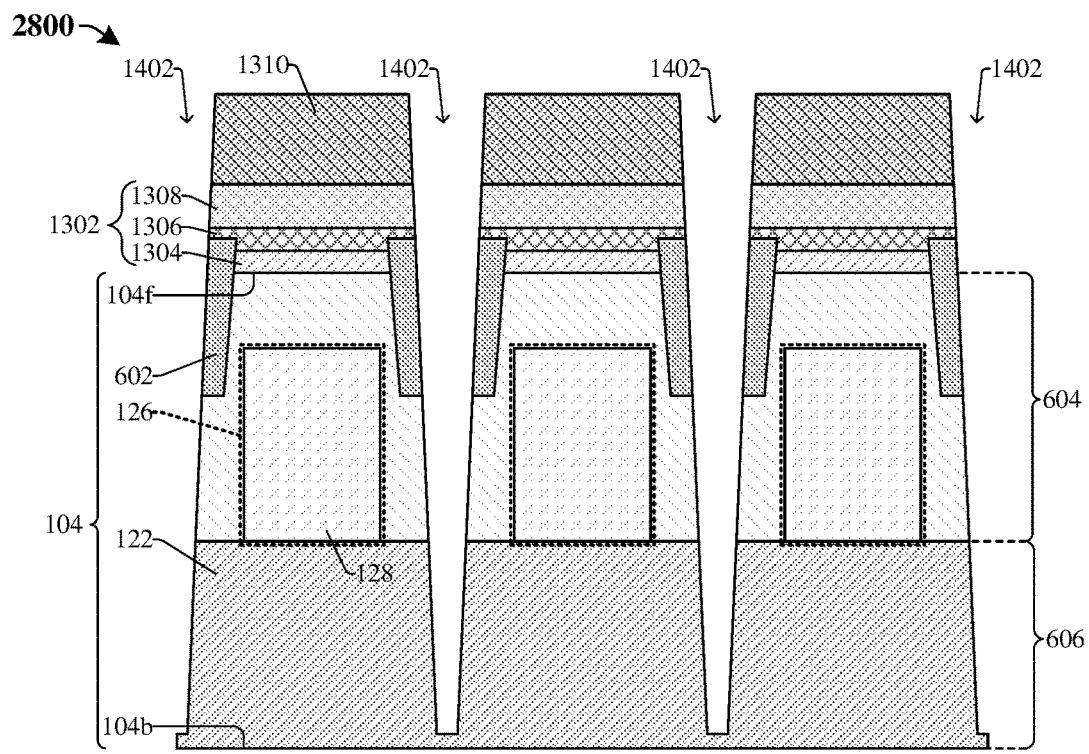

As illustrated in cross-sectional view 2800 of FIG. 28, a removal process is performed to remove the dielectric layer (2702 of FIG. 27). In some embodiments, the removal process includes performing a wet etch process and exposing the semiconductor substrate 104 to a wet etchant such as hydrofluoric acid.

Figure 29:
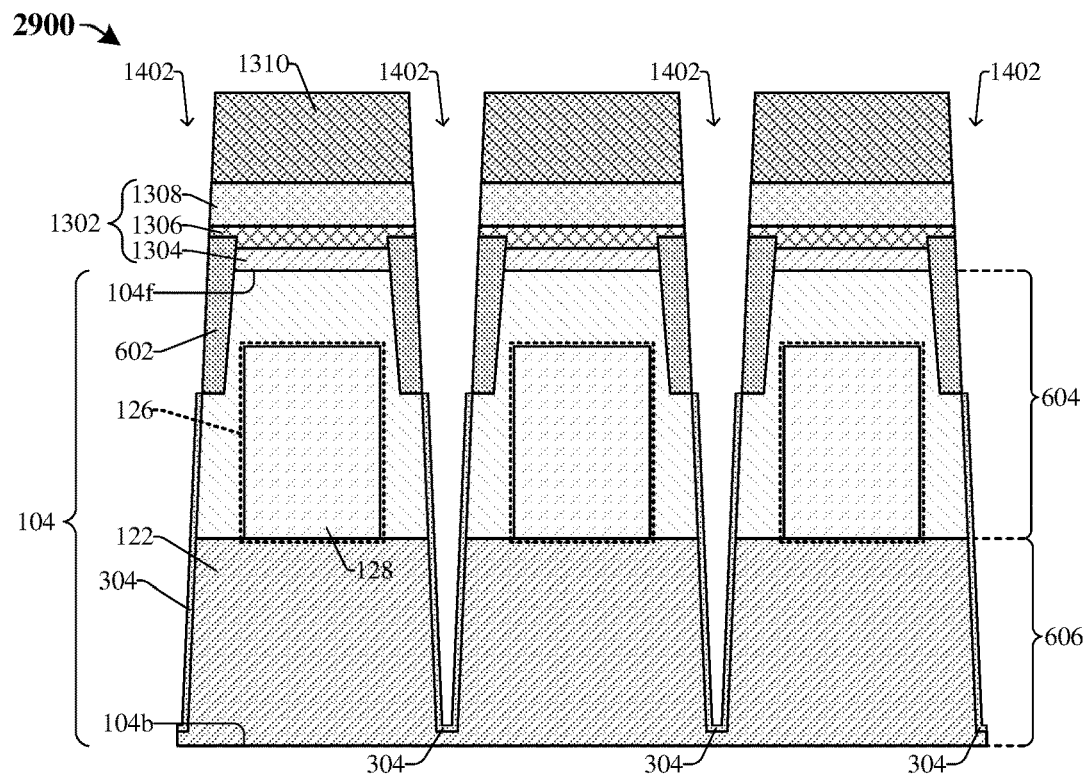

As illustrated in cross-sectional view 2900 of FIG. 29, a doped liner 304 is formed along sidewalls and a lower surface of the semiconductor substrate 104 that define the isolation structure opening 1402. In some embodiments, the doped liner 304 is formed by a selective epitaxial growth process. The selective epitaxial growth process may, for example, be an epitaxial process or another form of a deposition process such as CVD, plasma enhanced chemical vapor deposition (PE-CVD), ALD, PVD, or another suitable growth or deposition process. In further embodiments, the doped liner 304 is selectively grown such that the doped liner 304 is in-situ doped with the second dopant (e.g., gallium). The doped liner 304 may, for example, be or comprise epitaxial silicon doped with the second dopant (e.g., gallium) and has a doping concentration of the second dopant within a range of about $10^{14}$ to $2*10^{18}$ atoms/cm$^3$ or another suitable value.

Figure 30:
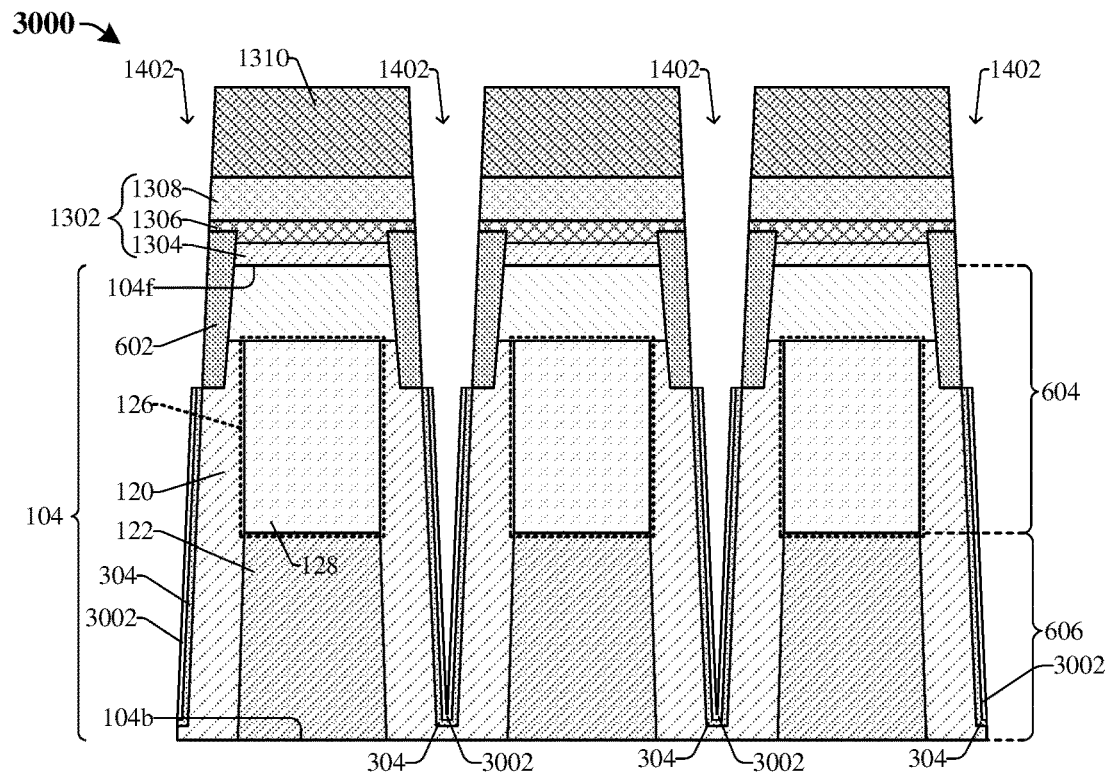

As illustrated in cross-sectional view 3000 of FIG. 30, an oxidation process is performed on the doped liner 304, thereby forming a dielectric layer 3002 over the doped liner 304 and a second doped region 120 within the semiconductor substrate 104. In some embodiments, the dielectric layer 3002 may be or comprise an oxide such as silicon dioxide and the second dopant (e.g., gallium). In yet further embodiments, the oxidation process converts at least a portion of the doped liner 304 to silicon dioxide doped with the second dopant (e.g., gallium). In some embodiments, the oxidation process includes performing an in-situ steam generation (ISSG) process or another suitable oxidation process. In yet further embodiments, the oxidation process includes exposing the semiconductor substrate 104 to an elevated temperature that is, for example, within a range of about 500 to 950 degrees Celsius, or another suitable value. In such embodiments, the oxidation process drives the second dopant (e.g., gallium) from the doped liner 304 and/or the dielectric layer 3002 into the semiconductor substrate 104, thereby forming the second doped region 120 within the semiconductor substrate 104. In various embodiments, the oxidation process drives the second dopant (e.g., gallium) a distance of at least 10 nm from the doped liner 304 into the semiconductor substrate 104. It will be appreciated that the annealing process driving the second dopant other distance values into the semiconductor substrate 104 is within the scope of the disclosure. Thus, the second doped region 120 is self-aligned along sidewalls and a lower surface of the semiconductor substrate 104 that defines the isolation structure opening 1402. In some embodiments, the second doped region 120 comprises the second dopant (e.g., gallium) and has a doping concentration within a range of about $10^{14}$ to $2*10^{18}$ atoms/cm$^3$ or another suitable value. In yet further embodiments, after forming the second doped region 120, a removal process is performed to remove the dielectric layer 3002 and/or the doped liner 304 (not shown).

Figure 31:
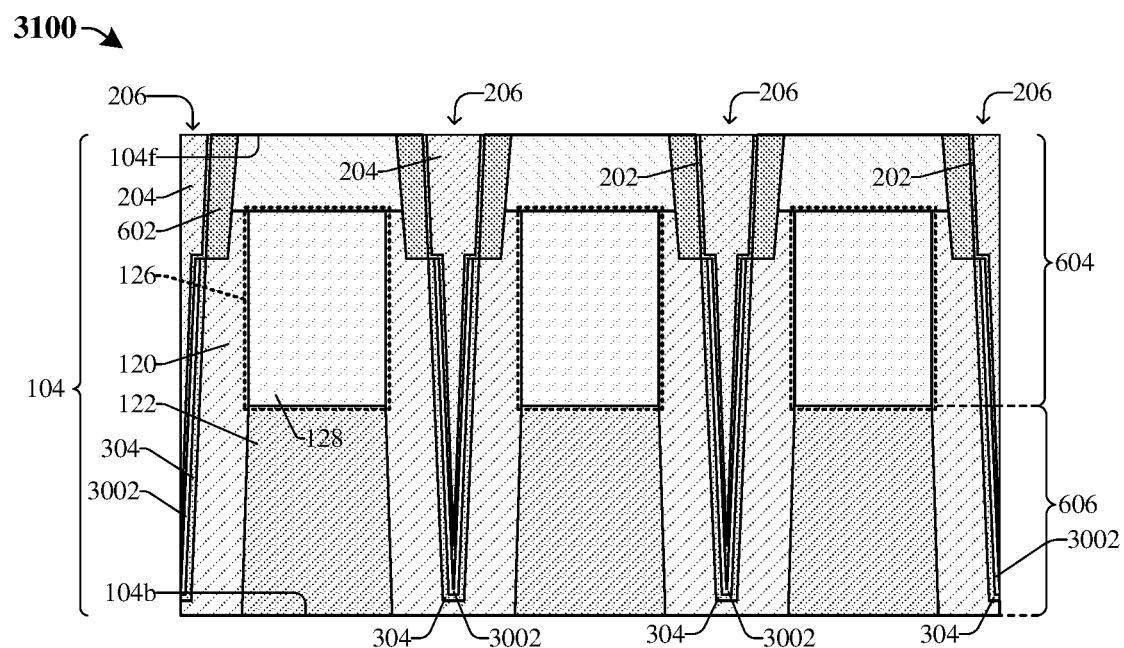

As illustrated in cross-sectional view 3100 of FIG. 31, an isolation structure 206 is formed within the semiconductor substrate 104. In some embodiments, the isolation structure 206 comprises a passivation layer 202 and a trench fill layer 204. In further embodiments, a process for forming the isolation structure 206 may include depositing (e.g., by CVD, PVD, ALD, etc.) the passivation layer 202 within the isolation structure opening (1402 of FIG. 30); depositing (e.g., by CVD, PVD, ALD, etc.) the trench fill layer 204 over the passivation layer 202, thereby filling the isolation structure opening (1402 of FIG. 30); and performing a planarization process (e.g., a CMP process) and/or an etch back process to remove at least a portion of the passivation layer 202 and/or the trench fill layer 204. In such embodiments, the planarization process and/or the etch back process can remove the photoresist structure (1310 of FIG. 30) and/or the masking layer (1302 of FIG. 30) from over the front-side surface 104f of the semiconductor substrate 104.

Figure 32:
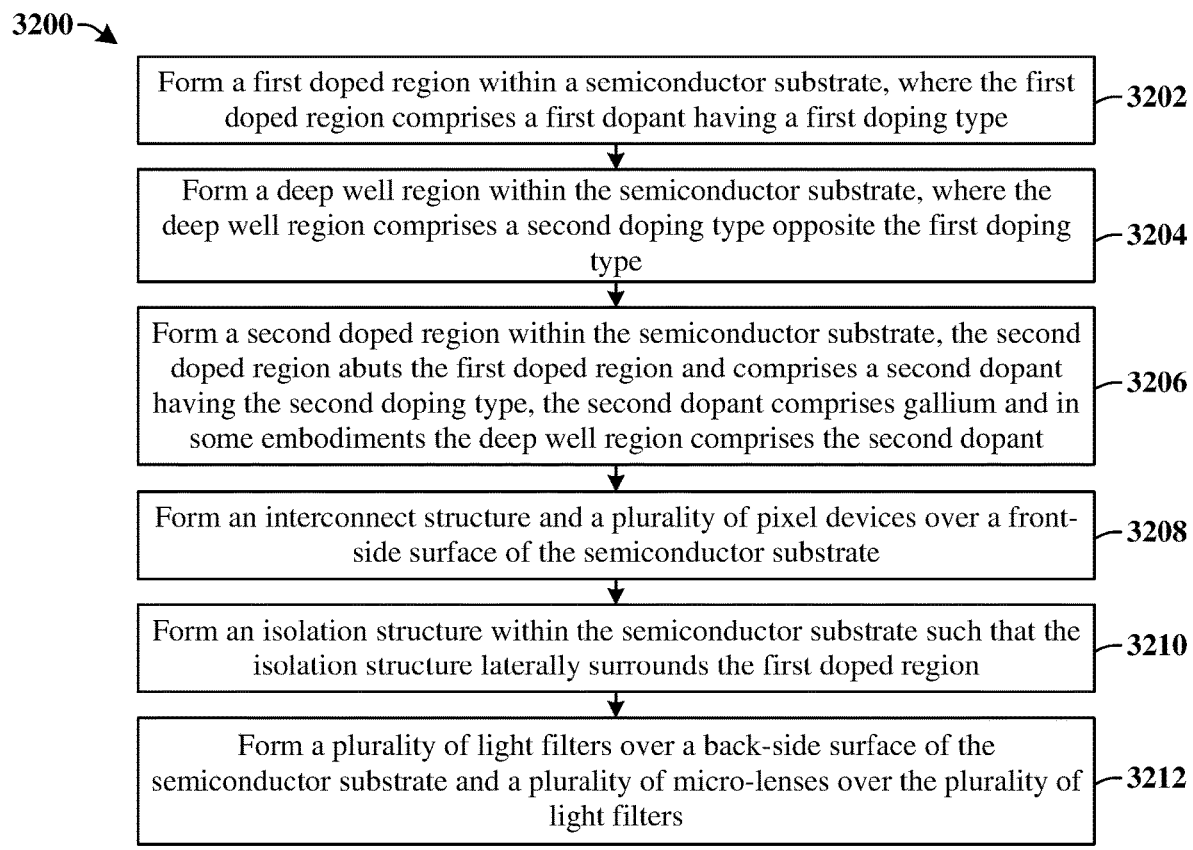
FIG. 32 illustrates a flowchart according to some embodiments of a method of forming an image sensor comprising a plurality of photodetectors having first doped regions and a second doped region laterally surrounding the first doped regions, where the second doped region comprises a second dopant configured to improve full well capacity of the photodetectors.

FIG. 32 illustrates a method 3200 of forming an image sensor comprising a plurality of photodetectors having first doped regions and a second doped region laterally surrounding the first doped regions, where the second doped region comprises a second dopant configured to improve full well capacity of the photodetectors in accordance with some embodiments. Although the method 3200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 3202, a first doped region is formed within a semiconductor substrate. The first doped region comprises a dopant having a first doping type. FIG. 7 illustrates a cross-sectional view 700 corresponding to some embodiments of act 3202. FIG. 12 illustrates a cross-sectional view 1200 corresponding to some alternative embodiments of act 3202.

At act 3204, a deep well region is formed within the semiconductor substrate. The deep well region comprises a second doping type opposite the first doping type. FIG. 8 illustrates a cross-sectional view 800 corresponding to some embodiments of act 3204. FIG. 12 illustrates a cross-sectional view 1200 corresponding to some alternative embodiments of act 3204.

At act 3206, a second doped region is formed within the semiconductor substrate. The second doped region abuts the first doped region and comprises a second dopant having the second doping type. The second dopant comprises gallium. In some embodiments, the deep well region comprises the second dopant. FIG. 8 illustrates a cross-sectional view 800 corresponding to some embodiments of act 3206. FIGS. 15-18 illustrate cross-sectional views 1500-1800 corresponding to some alternative embodiments of act 3206. Further, FIGS. 23-26 illustrate cross-sectional views 2300-2600 corresponding to some further alternative embodiments of act 3206. Furthermore, FIGS. 27-30 illustrate cross-sectional views 2700-3000 corresponding to yet another alternative embodiment of act 3206.

At act 3208, an interconnect structure and a plurality of pixel devices are formed over a front-side surface of the semiconductor substrate. FIG. 9 illustrates a cross-sectional view 900 corresponding to some embodiments of act 3208. FIG. 21 illustrates a cross-sectional view 2100 corresponding to some alternative embodiments of act 3208.

At act 3210, an isolation structure is formed within the semiconductor substrate such that the isolation structure laterally surrounds the first doped region. FIG. 10 illustrates a cross-sectional view 1000 corresponding to some embodiments of act 3210. FIGS. 14, 19, and 20 illustrate cross-sectional views 1400, 1900, and 2000 corresponding to some alternative embodiments of act 3210.

At act 3212, a plurality of light filters are formed over a back-side surface of the semiconductor substrate and a plurality of micro-lenses are formed over the plurality of light filters. FIG. 11 illustrates a cross-sectional view 1100 corresponding to some embodiments of act 3212. FIG. 22 illustrates a cross-sectional view 2200 corresponding to some alternative embodiments of act 3212.

Accordingly, in some embodiments, the present disclosure relates to an image sensor comprising a first doped region disposed within a semiconductor substrate, where the first doped region comprises a dopant having has a first doping type. A second doped region abuts the first doped region and comprises a second dopant having a second doping type opposite the first doping type, where the second dopant comprises gallium.

In some embodiments, the present application provides an image sensor including a photodetector disposed in a semiconductor substrate, wherein the photodetector comprises a first doped region comprising a dopant having a first doping type; a deep well region disposed within the semiconductor substrate, wherein the deep well region extends from a back-side surface of the semiconductor substrate to a top surface of the first doped region; and a second doped region disposed within the semiconductor substrate and abutting the first doped region, wherein the second doped region and the deep well region comprise a second dopant having a second doping type opposite the first doping type, wherein the second dopant comprises gallium.

In some embodiments, the present application provides an image sensor including a first photodetector and a second photodetector disposed in a semiconductor substrate, wherein the first and second photodetectors respectively comprise a first doped region having a first doping type; a plurality of pixel devices disposed along a front-side surface of the semiconductor substrate; an isolation structure extending into the semiconductor substrate, wherein the isolation structure laterally surrounds the first photodetector and the second photodetector, wherein the isolation structure comprises a trench fill layer and a passivation layer disposed between the semiconductor substrate and the trench fill layer; a deep well region disposed within the semiconductor substrate and overlying the first and second photodetectors, wherein the deep well region comprises a second doping type opposite the first doping type; and a second doped region disposed within the semiconductor substrate and extending along sidewalls of the isolation structure, wherein the second doped region comprises the second doping type and abuts the first doped region of the first and second photodetectors, wherein the second doped region is disposed between the isolation structure and the deep well region, and wherein the second doping type comprises gallium.

In some embodiments, the present application provides a method for forming an image sensor, the method includes performing a first ion implantation process on a front-side surface of a semiconductor substrate to form first doped regions within the semiconductor substrate, wherein the first doped regions comprise a dopant having a first doping type; forming a second doped region within the semiconductor substrate such that the second doped region abuts the first doped regions, wherein the second doped region comprises a second dopant having a second doping type opposite the first doping type, wherein the second dopant comprises gallium; and forming a plurality of semiconductor devices along the front-side surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
   performing a first ion implantation process on a front-side surface of a semiconductor substrate to form first doped regions within the semiconductor substrate, wherein the first doped regions comprise a first dopant having a first doping type;
   forming a second doped region within the semiconductor substrate such that the second doped region abuts the first doped regions, wherein the second doped region comprises a second dopant having a second doping type opposite the first doping type, wherein the second dopant comprises gallium, wherein forming the second doped region comprises:
      patterning the front-side surface of the semiconductor substrate to form an opening within the semiconductor substrate;
      forming a doped liner along sidewalls and a lower surface of the semiconductor substrate that define the opening, wherein the doped liner comprises the second dopant, wherein the doped liner is formed before forming the second doped region;
      performing an annealing process on the semiconductor substrate, thereby forming the second doped region within the semiconductor substrate, wherein the annealing process drives the second dopant from the doped liner into the semiconductor substrate; and
   forming a plurality of semiconductor devices along the front-side surface of the semiconductor substrate.

2. The method of claim 1, wherein a doping concentration of the second dopant within the second doped region is within a range of about $10^{14}$ to $2*10^{18}$ atoms/cm$^3$.

3. The method of claim 1, wherein forming the second doped region comprises:
   selectively forming a masking layer over the front-side surface of the semiconductor substrate; and
   performing an ion implantation process according to the masking layer, thereby forming the second doped region.

4. The method of claim 1, wherein forming the doped liner includes performing a plasma doping process.

5. The method of claim 1, wherein the doped liner is formed by a selective epitaxial growth process.

6. The method of claim 1, further comprising:
   forming an isolation structure in the semiconductor substrate, wherein the second doped region extends along opposing sidewalls of the isolation structure and cups a bottom surface of the isolation structure.

7. The method of claim 6, wherein forming the isolation structure comprises:
   depositing a passivation layer over the semiconductor substrate and lining the opening, wherein the doped liner is disposed between the passivation layer and the semiconductor substrate; and
   depositing a trench fill layer over the passivation layer.

8. A method for forming an image sensor, the method comprising:
   forming a photodetector within a semiconductor substrate, wherein the photodetector comprises a first doped region comprising a dopant having a first doping type;
   forming a second doped region within the semiconductor substrate and along the first doped region, wherein the second doped region comprises a second dopant having a second doping type opposite the first doping type, wherein an atomic size of the second dopant is greater than an atomic size of boron;
   forming an isolation structure within the semiconductor substrate, wherein the isolation structure is disposed on opposing sides of the first doped region, wherein the second doped region extends along opposing sidewalls of the isolation structure; and
   forming a doped liner between the isolation structure and the first doped region, wherein the doped liner comprises the second dopant.

9. The method of claim 8, wherein a diffusivity of the second dopant at temperatures of about 700 degrees Celsius or greater is less than about $5.4*10^{-15}$ cm$^2$/s.

10. The method of claim 8, wherein the doped liner is formed before forming the second doped region.

11. The method of claim 8, wherein forming the second doped region comprises performing an annealing process on the doped liner thereby driving the second dopant from the doped liner into the semiconductor substrate.

12. The method of claim 11, wherein the annealing process is performed at a temperature within a range of about 500 to 950 degrees Celsius.

13. The method of claim 8, wherein the atomic size of the second dopant is less than an atomic size of indium.

14. The method of claim 8, wherein a diffusivity of the second dopant at a temperature of about 700 degrees Celsius or greater is less than a diffusivity of boron.

15. The method of claim 8, further comprising:
forming a plurality of semiconductor devices along a front-side surface of the semiconductor substrate, wherein the second doped region is formed before forming the plurality of semiconductor devices.

16. A method for forming an image sensor, the method comprising:
forming a photodetector within a semiconductor substrate, wherein the photodetector comprises a first doped region having a first doping type;
forming a deep well region within the semiconductor substrate and along a back-side surface of the semiconductor substrate, wherein the deep well region has a second doping type opposite the first doping type;
forming a shallow trench isolation (STI) structure extending into a front-side surface of the semiconductor substrate;
patterning the semiconductor substrate to form an opening extending into the front-side surface of the semiconductor substrate and extending through the STI structure;
forming an isolation structure within the opening; and
forming a second doped region within the semiconductor substrate and along sidewalls of the isolation structure, wherein the second doped region has the second doping type and comprises gallium.

17. The method of claim 16, wherein the isolation structure extends vertically through the STI structure.

18. The method of claim 16, further comprising:
performing a thinning process into the back-side surface of the semiconductor substrate, wherein the thinning process removes at least a portion of the deep well region and/or the second doped region.

19. The method of claim 8, wherein the doped liner comprises amorphous silicon doped with the dopant.

20. The method of claim 8, wherein the doped liner is formed after forming the photodetector.

* * * * *